(12) United States Patent
Chung et al.

(10) Patent No.: US 9,853,012 B2
(45) Date of Patent: Dec. 26, 2017

(54) SEMICONDUCTOR PACKAGES HAVING THROUGH ELECTRODES AND METHODS OF FABRICATING THE SAME

(71) Applicant: SAMSUNG ELECTRONICS CO., LTD., Suwon-si (KR)

(72) Inventors: Hyunsoo Chung, Hwaseong-si (KR); Jongyeon Kim, Suwon-si (KR); In-Young Lee, Yongin-si (KR); Tae-Je Cho, Hwaseong-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

(21) Appl. No.: 15/010,438

(22) Filed: Jan. 29, 2016

(65) Prior Publication Data

US 2016/0148909 A1 May 26, 2016

Related U.S. Application Data

(62) Division of application No. 14/264,123, filed on Apr. 29, 2014, now Pat. No. 9,287,140.

(30) Foreign Application Priority Data

Jun. 27, 2013 (KR) .......................... 10-2013-0074572

(51) Int. Cl.
*H01L 23/02* (2006.01)
*H01L 25/065* (2006.01)
(Continued)

(52) U.S. Cl.
CPC .... *H01L 25/0657* (2013.01); *H01L 21/02016* (2013.01); *H01L 21/486* (2013.01);
(Continued)

(58) Field of Classification Search
CPC ....... H01L 2924/00014; H01L 2924/00; H01L 2224/73265; H01L 2224/48227;
(Continued)

(56) References Cited

U.S. PATENT DOCUMENTS 6,642,081 B1 11/2003 Patti
6,831,367 B2 12/2004 Sekine
(Continued)

FOREIGN PATENT DOCUMENTS

CN          101038883 A          9/2007
CN          202394958 U          8/2012
(Continued)

OTHER PUBLICATIONS

Communication dated Jun. 28, 2017 by the State Intellectual Property Office of P.R. China in counterpart Chinese Patent Application No. 201410290157.2.

*Primary Examiner* — Cuong B Nguyen
(74) *Attorney, Agent, or Firm* — Sughrue Mion, PLLC

(57) ABSTRACT

Provided are semiconductor packages having through electrodes and methods of fabricating the same. The method may include may include forming a wafer-level package including first semiconductor chips stacked on a second semiconductor chip, forming a chip-level package including fourth semiconductor chips stacked on a third semiconductor chip stacking a plurality of the chip-level packages on a back surface of the second semiconductor substrate of the wafer-level package, polishing the first mold layer of the wafer-level package and the first semiconductor chips to expose a first through electrodes of the first semiconductor chip, and forming outer electrodes on the polished first semiconductor chips to be connected to the first through electrodes, respectively.

9 Claims, 25 Drawing Sheets

(51) Int. Cl.
  *H01L 21/48* (2006.01)
  *H01L 25/00* (2006.01)
  *H01L 21/02* (2006.01)
  *H01L 23/31* (2006.01)
  *H01L 21/56* (2006.01)
  *H01L 23/00* (2006.01)
  *H01L 25/03* (2006.01)
  *H01L 21/768* (2006.01)

(52) U.S. Cl.
  CPC ...... *H01L 21/561* (2013.01); *H01L 21/76898* (2013.01); *H01L 23/3128* (2013.01); *H01L 23/3135* (2013.01); *H01L 24/92* (2013.01); *H01L 24/94* (2013.01); *H01L 24/97* (2013.01); *H01L 25/03* (2013.01); *H01L 25/50* (2013.01); *H01L 24/16* (2013.01); *H01L 2224/131* (2013.01); *H01L 2224/16145* (2013.01); *H01L 2224/16225* (2013.01); *H01L 2224/16227* (2013.01); *H01L 2224/17181* (2013.01); *H01L 2224/9202* (2013.01); *H01L 2224/94* (2013.01); *H01L 2224/97* (2013.01); *H01L 2225/06513* (2013.01); *H01L 2225/06517* (2013.01); *H01L 2225/06541* (2013.01); *H01L 2924/12042* (2013.01); *H01L 2924/15311* (2013.01); *H01L 2924/181* (2013.01)

(58) Field of Classification Search
  CPC . H01L 2924/00012; H01L 2224/73204; H01L 2224/32145; H01L 2924/15311; H01L 2924/181; H01L 2224/48247
  See application file for complete search history.

(56) References Cited

U.S. PATENT DOCUMENTS

| | | | |
|---|---|---|---|
| 7,507,637 B2 | 3/2009 | Suh et al. | |
| 7,781,235 B2 | 8/2010 | Luo et al. | |
| 8,138,023 B2* | 3/2012 | Egawa | H01L 21/563 257/E25.006 |
| 8,349,729 B2 | 1/2013 | Barth et al. | |
| 2004/0061238 A1 | 4/2004 | Sekine | |
| 2004/0115867 A1 | 6/2004 | Shibata | |
| 2007/0196955 A1 | 8/2007 | Hayashi et al. | |
| 2007/0218678 A1 | 9/2007 | Suh et al. | |
| 2008/0153187 A1 | 6/2008 | Luo et al. | |
| 2009/0001602 A1* | 1/2009 | Chung | H01L 24/94 257/777 |
| 2010/0032811 A1 | 2/2010 | Ding et al. | |
| 2010/0102428 A1* | 4/2010 | Lee | H01L 23/481 257/686 |
| 2011/0186992 A1 | 8/2011 | Wu et al. | |
| 2012/0032342 A1 | 2/2012 | Min et al. | |
| 2012/0171818 A1 | 7/2012 | Barth et al. | |
| 2013/0037942 A1 | 2/2013 | Hwang et al. | |
| 2014/0001612 A1* | 1/2014 | Yu | H01L 23/5384 257/668 |

FOREIGN PATENT DOCUMENTS

| | | |
|---|---|---|
| CN | 202523706 U | 11/2012 |
| CN | 102956616 A | 3/2013 |
| KR | 10-2011-0016017 A | 2/2011 |
| KR | 10-2011-0044964 A | 5/2011 |
| KR | 10-2011-0046435 A | 5/2011 |
| KR | 10-2011-0048733 A | 5/2011 |
| KR | 10-1056750 B1 | 8/2011 |
| KR | 10-1099578 B1 | 12/2011 |
| KR | 10-1099587 B1 | 12/2011 |
| KR | 10-2012-0126365 A | 11/2012 |

* cited by examiner

SEMICONDUCTOR PACKAGES HAVING THROUGH ELECTRODES AND METHODS OF FABRICATING THE SAME

CROSS-REFERENCE TO RELATED APPLICATION

This application is a divisional of U.S. patent application Ser. No. 14/264,123, filed on Apr. 29, 2014, which is U.S. non-provisional patent application claims priority from Korean Patent Application No. 10-2013-0074572, filed on Jun. 27, 2013, in the Korean Intellectual Property Office, the entire contents of which are hereby incorporated by reference.

BACKGROUND

Example embodiments of the inventive concept relate to a semiconductor product, and in particular, to semiconductor packages having through electrodes and methods of fabricating the same.

Conventionally, a semiconductor package has been realized using a wire bonding technology. Recently, a through-silicon via (TSV) technology was suggested to meet an increasing demand for high performance. According to the conventional TSV technology, an wafer is bonded to a carrier using an adhesives layer, and then, the carrier is de-bonded from the wafer, after a polishing process to a backside surface of the wafer. Likewise, additional steps of handling the carrier are needed, and thus, the conventional TSV technology suffers from low productivity and high fabrication cost.

SUMMARY

Therefore, it is an aspect of an example embodiment to provide a method of forming a semiconductor package, the method including: providing a first chip and a second chip, the providing including: providing a first active layer on a front surface of a first substrate of a first chip; providing a second active layer on a front surface of a second substrate of a second chip; stacking the first chip and the second chip so that the first active layer of the first chip faces the second active layer of the second chip; forming a mold layer on the first chip and on the front surface of the second substrate of the second chip to provide rigidity to the semiconductor package, the mold layer including a polymer material; thinning a back surface of the second substrate having the mold layer; and forming back-side electrodes on the thinned back surface of the second substrate, the back-side electrodes being electrically connected to second through electrodes in the second substrate.

The thinning the back surface of the second substrate may include thinning the back surface using a mechanical process.

The thinning the back surface of the second substrate may expose the second through electrodes in the second substrate, the second through electrodes being electrically connected to the second active layer.

In an example embodiment, the method may further include forming second through electrodes in the thinned second substrate before forming the back-side electrodes.

In another example embodiment, the method may further include providing first connection electrodes between the first chip and the second chip to electrically connect the first active layer and the second active layer.

In accordance with an example embodiment, there is a method of forming a plurality of semiconductor packages, the method including: forming a first semiconductor package according to the method of the above; stacking a second semiconductor package on the first semiconductor package, the stacking the second semiconductor package including: inverting the first semiconductor package so that the thinned back surface of the second chip faces upward; and stacking the second semiconductor package on the inverted first semiconductor package so that a back surface of the second semiconductor package faces the thinned back surface of the second chip of the first semiconductor package.

In one example embodiment, the method may further include thinning the back surface of the first chip of the first substrate in the first semiconductor package.

In another example embodiment, the method may further include forming first back-side electrodes on the thinned back surface of the first substrate, the first back-side electrodes being electrically connected to a plurality of first through electrodes in the first substrate, the plurality of first through electrodes being electrically connected to the first active layer.

The thinning the back surface of the first chip of the first substrate in the first semiconductor package may expose the plurality of first through electrodes in the first substrate.

In yet another example embodiment, the method may further include forming the first through electrodes in the thinned back surface of the first substrate before forming the first-back-side electrodes.

The providing the first and the second chips may not include bonding a carrier to any one of the first and the second chips and further may not include debonding the carrier from any one of the first and the second chips.

The first active layer may include first transistors and the second active layer may include second transistors.

A coefficient of thermal expansion (CTE) of the substrate of the second chip and a CTE of the mold layer may be within an order of magnitude.

A ratio of a coefficient of thermal expansion (CTE) of the substrate of the second chip and a CTE of the mold layer may be in a range from 1 to 3.

In accordance with an example embodiment, there is a semiconductor device including: a first semiconductor package including: a first chip including a first active layer at a first front side of the first chip; a second chip including a second active layer at a second front side of the second chip, the first and the second chips being stacked so that the first active layer faces the second active layer; and a mold layer disposed between the first and the second chips; and a second semiconductor package including: a third chip including a third active layer at a third front side of the third chip; and a fourth chip including a fourth active layer at a fourth front side of the fourth chip, the third and the fourth chips being stacked so that the third active layer faces the fourth active layer; wherein a third back side of the third chip faces a second back side of the second chip.

In an example embodiment, the first chip further includes first through electrodes, the second chip further includes second through electrodes, the third chip further includes third through electrodes, and the fourth chip further includes fourth through electrodes.

In another example embodiment, there semiconductor device further includes a plurality of electrodes which connect the second through electrodes and the third through electrodes.

The first chip may have a first width and the second chip may have a second width that is longer than the first width.

The fourth chip may have a fourth width and the third chip may have a third width that is longer than the fourth width.

A coefficient of thermal expansion (CTE) of the substrate of the second chip and a CTE of the mold layer may be within an order of magnitude.

A ratio of a coefficient of thermal expansion (CTE) of the substrate of the second chip and a CTE of the mold layer may be in a range from 1 to 3.

In an example embodiment, the device further includes first connection electrodes electrically connecting the first and the second active layers.

In accordance with another example embodiment, there is a semiconductor device including: a first semiconductor package including: a first chip including a first active layer at a first front side of the first chip; a second chip including a second active layer at a second front side of the second chip, the second chip being stacked on the first chip; and a mold layer disposed between the first and the second chips; and a second semiconductor package including: a third chip including a third active layer at a third front side of the third chip; and a fourth chip including a fourth active layer at a fourth front side of the fourth chip, the fourth chip being stacked on the third chip; wherein a third back side of the third chip faces a second back side of the second chip and wherein the first chip has a first width and the second chip has a second width that is longer than the first width.

The fourth chip may have a fourth width and the third chip as a third width that is longer than the fourth width.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 1O is a sectional view illustrating a semiconductor package according to an embodiment modified from that of FIG. 1M.

Figure 1A:
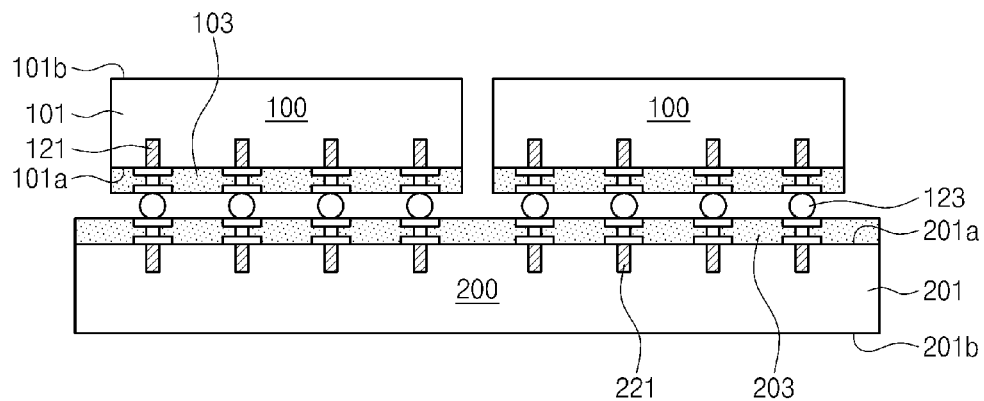
FIGS. 1A through 1M are sectional views illustrating a method of fabricating a semiconductor package according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A through 1M are sectional views illustrating a method of fabricating a semiconductor package according to example embodiments of the inventive concept. FIGS. 1N and 1O are sectional views illustrating semiconductor packages according to embodiment modified from those of FIGS. 1L and 1M, respectively.

Referring to FIG. 1A, a plurality of first semiconductor chips 100 may be stacked, in a chip-on-wafer (COW) manner, on a second semiconductor chip 200. For example, the first semiconductor chips 100 may be stacked on a second semiconductor substrate 201 of the second semiconductor chip 200 to form the chip-on-wafer structure.

The first semiconductor chip 100 may include a first semiconductor substrate 101 having a front surface 101a and a back surface 101b, a first integrated circuit layer 103 provided on the front surface 101a of the first semiconductor substrate 101, and one or more first through electrodes 121 vertically penetrating a portion of the first semiconductor substrate 101 to be electrically connected to the first integrated circuit layer 103. The first semiconductor substrate 101 may be provided in the form of a chip and be made of a semiconductor material (e.g., silicon). The first integrated circuit layer 103 may include a memory circuit, a logic circuit, or any combination thereof. The first through electrode 121 may be provided in a via-first or via-middle manner, on the first semiconductor substrate 101.

The second semiconductor chip 200 may include the second semiconductor substrate 201 having a front surface 201a and a back surface 201b, a second integrated circuit layer 203 provided on the front surface 201a of the second semiconductor substrate 201, and one or more second through electrodes 221 vertically penetrating a portion of the second semiconductor substrate 201 to be electrically connected to the second integrated circuit layer 203. The second semiconductor substrate 201 may be provided in the form of a wafer (or in wafer-level) and be formed of a semiconductor material (e.g., silicon). The second integrated circuit layer 203 may include a memory circuit, a logic circuit, or any combination thereof. The second through electrode 221 may be provided, in a via-first or via-middle manner, on the second semiconductor substrate 201.

The first semiconductor chips 100 may be stacked, in the front-to-front manner, on the second semiconductor chip 200 and be electrically connected to the second semiconductor chip 200. For example, the first semiconductor chips 100 may be bonded in a flip-chip manner on the second semiconductor chip 200, and thus, the front surface 101a of the first semiconductor substrate 101 may face the front surface 201a of the second semiconductor substrate 201. First connection electrodes 123 (e.g., provided in the form of a solder ball) are provided between the first semiconductor chip 100 and the second semiconductor chip 200 to electrically connect the first integrated circuit layer 103 to the second integrated circuit layer 203. In another example embodiment, the first connection electrodes 123 are not provided between the first semiconductor chip 100 and the second semiconductor chip 200 to electrically connect the first integrated circuit layer 103 to the second integrated circuit layer 203.

Figure 1B:
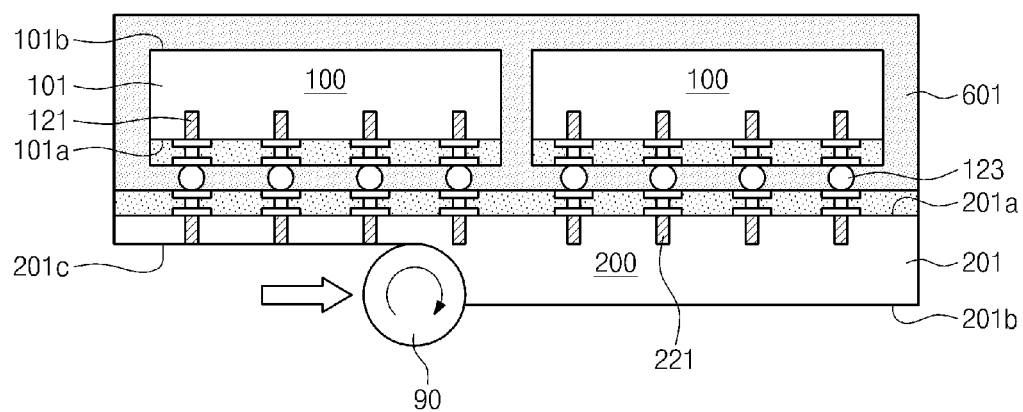
Figure 1C:
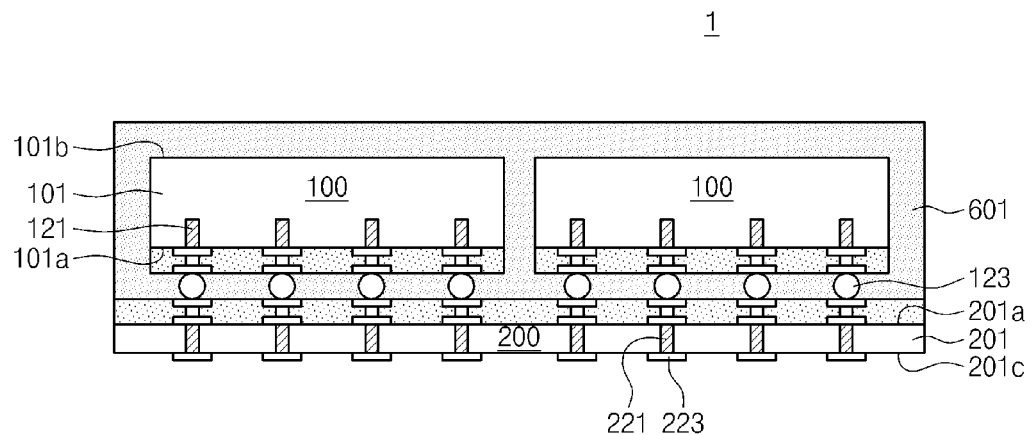
Figure 1D:
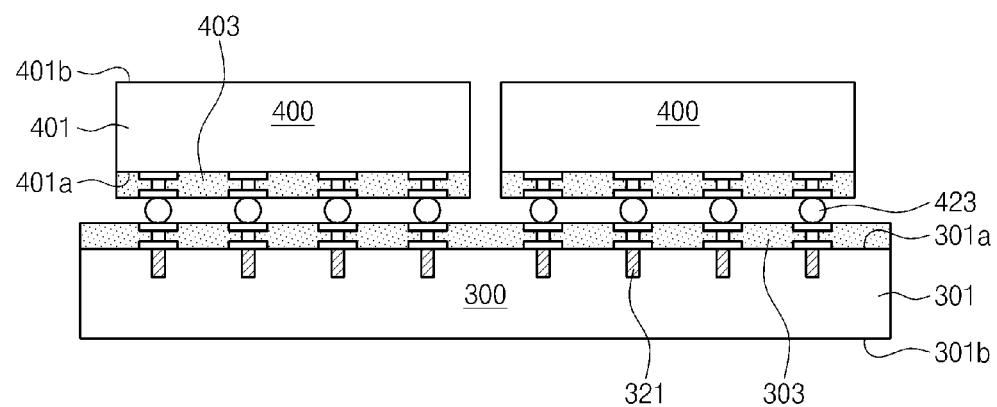
Figure 1E:
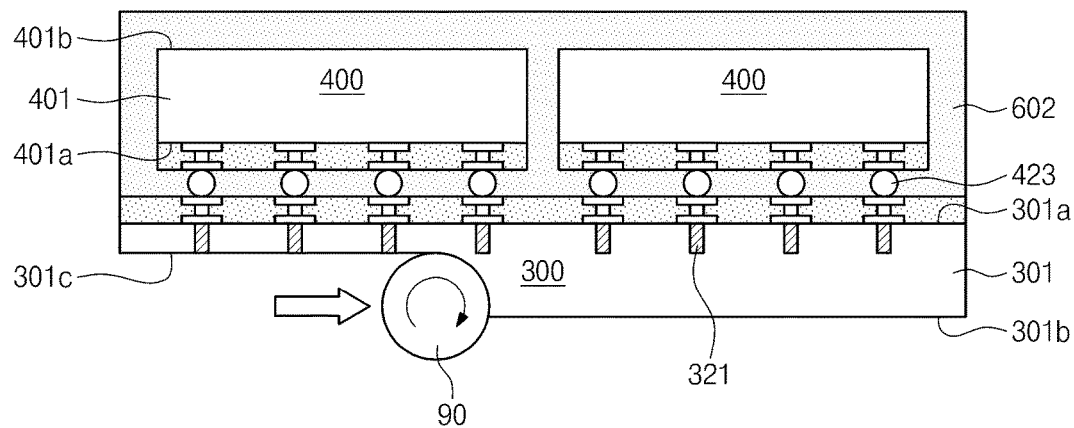
Figure 1F:
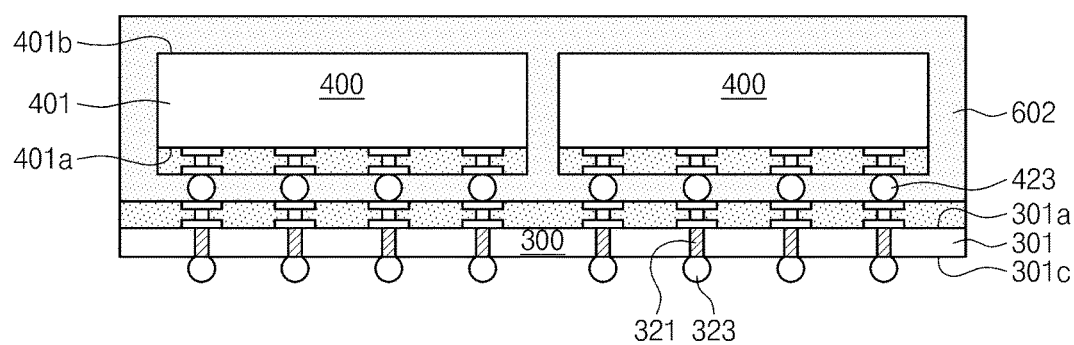
Figure 1G:
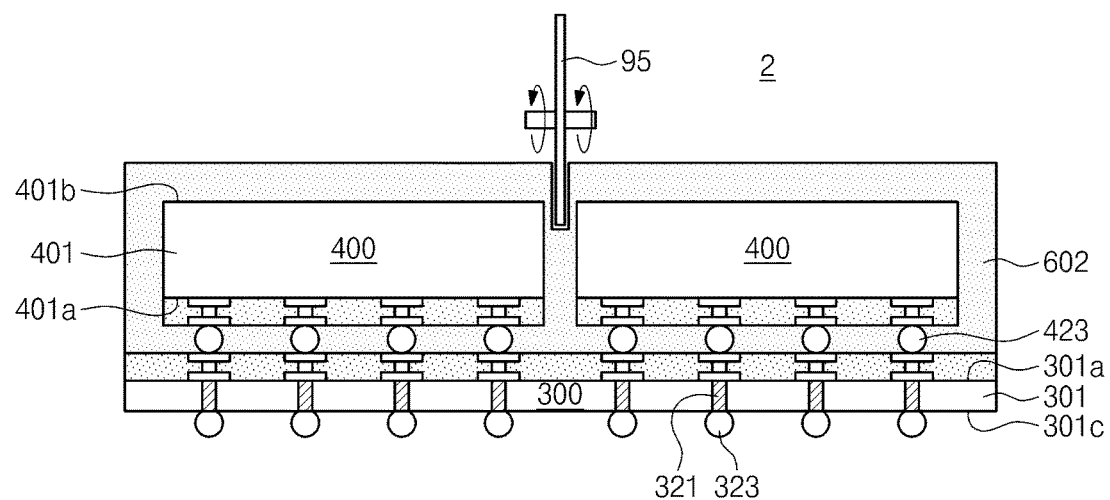
Figure 1H:
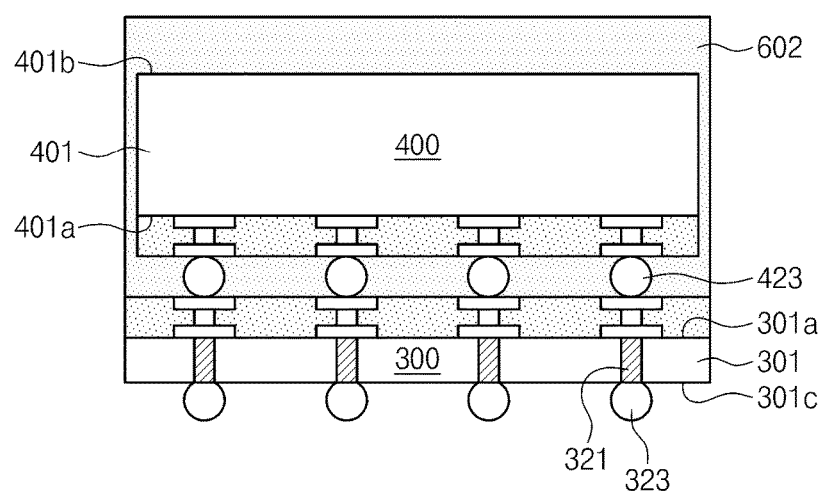
Figure 1I:
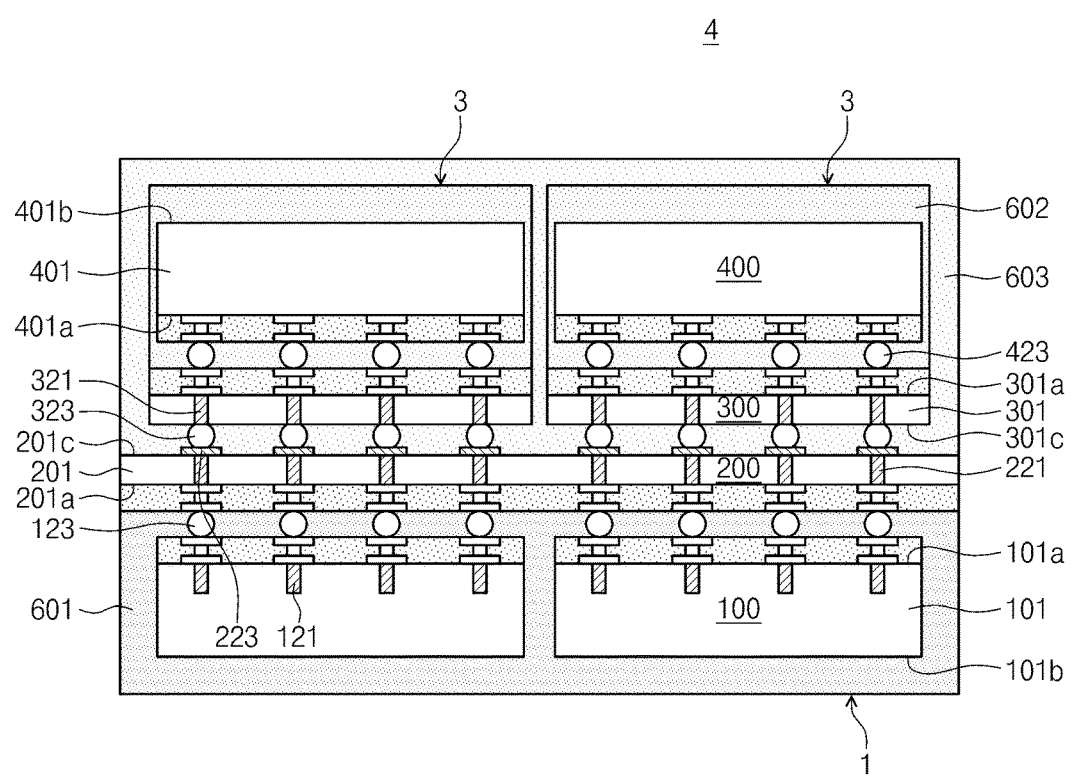
Figure 1J:
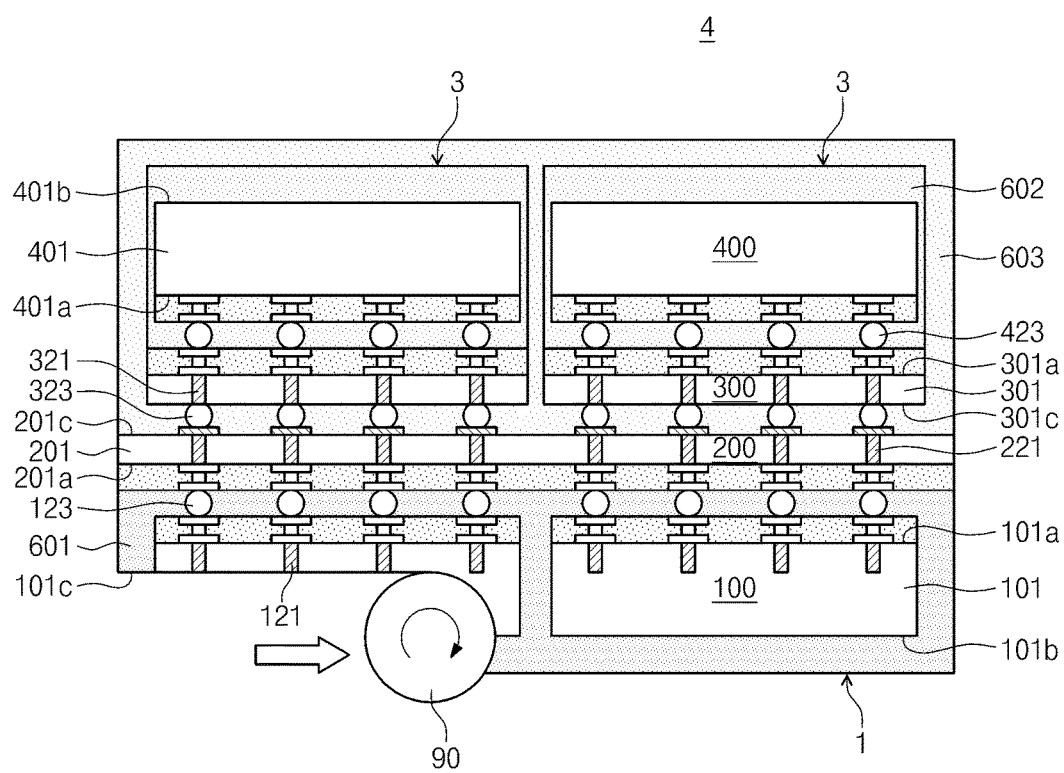
Figure 1K:
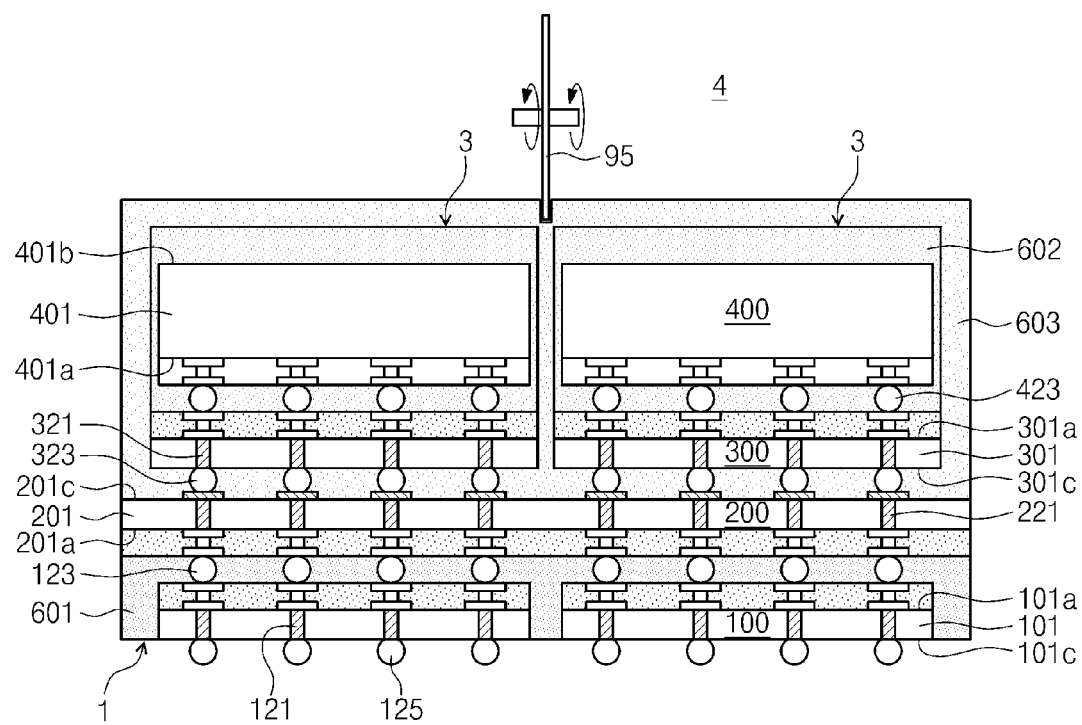
Figure 1L:
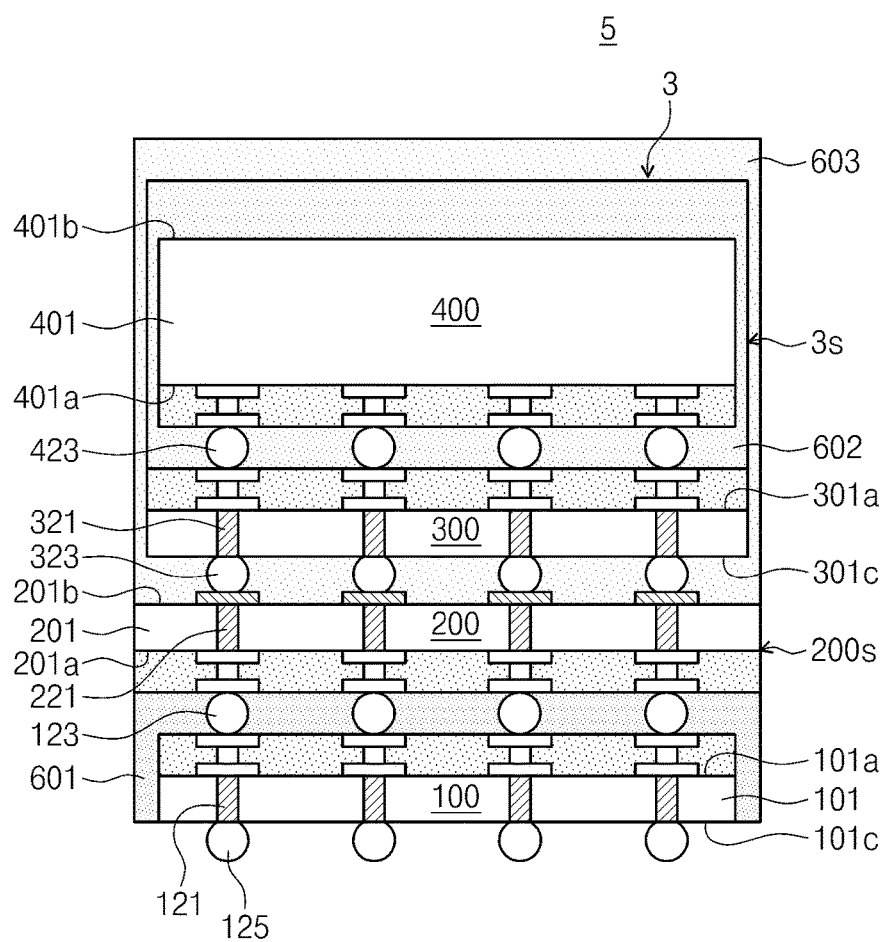
Figure 1M:
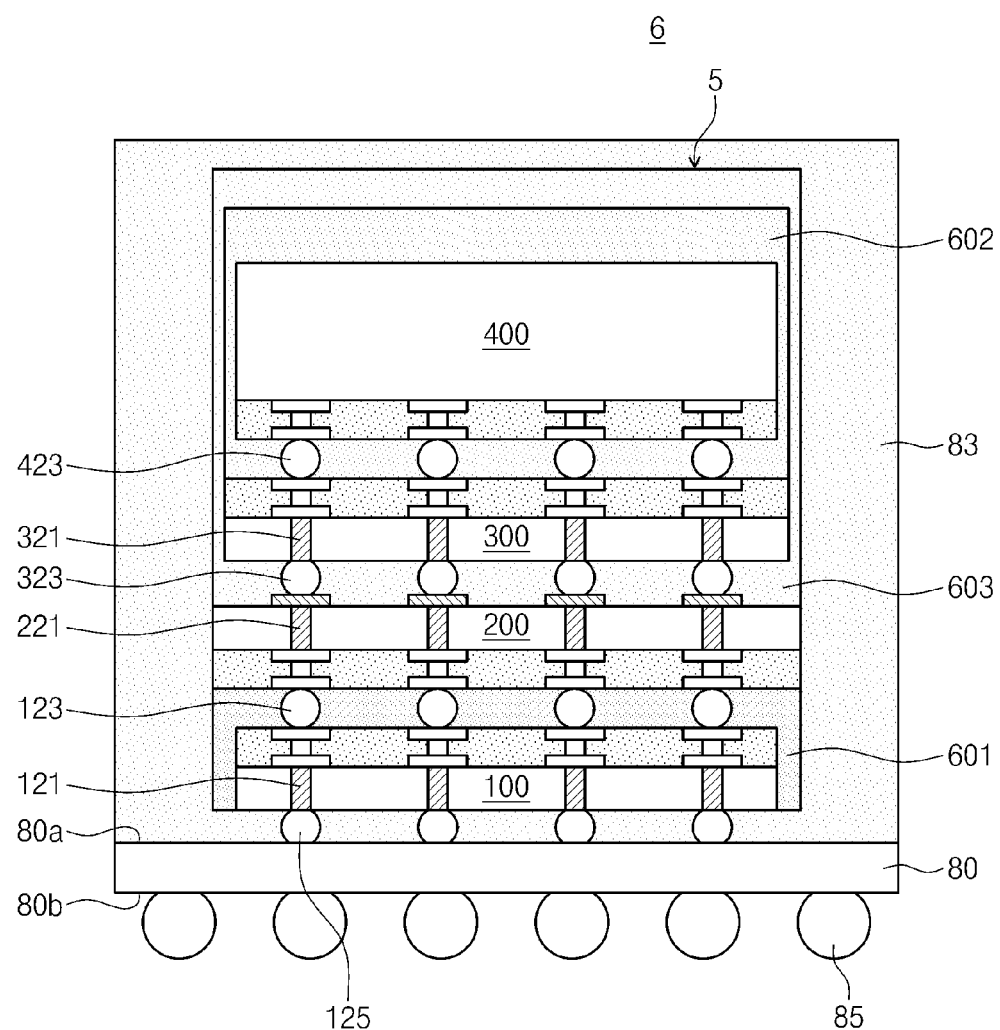
Figure 1N:
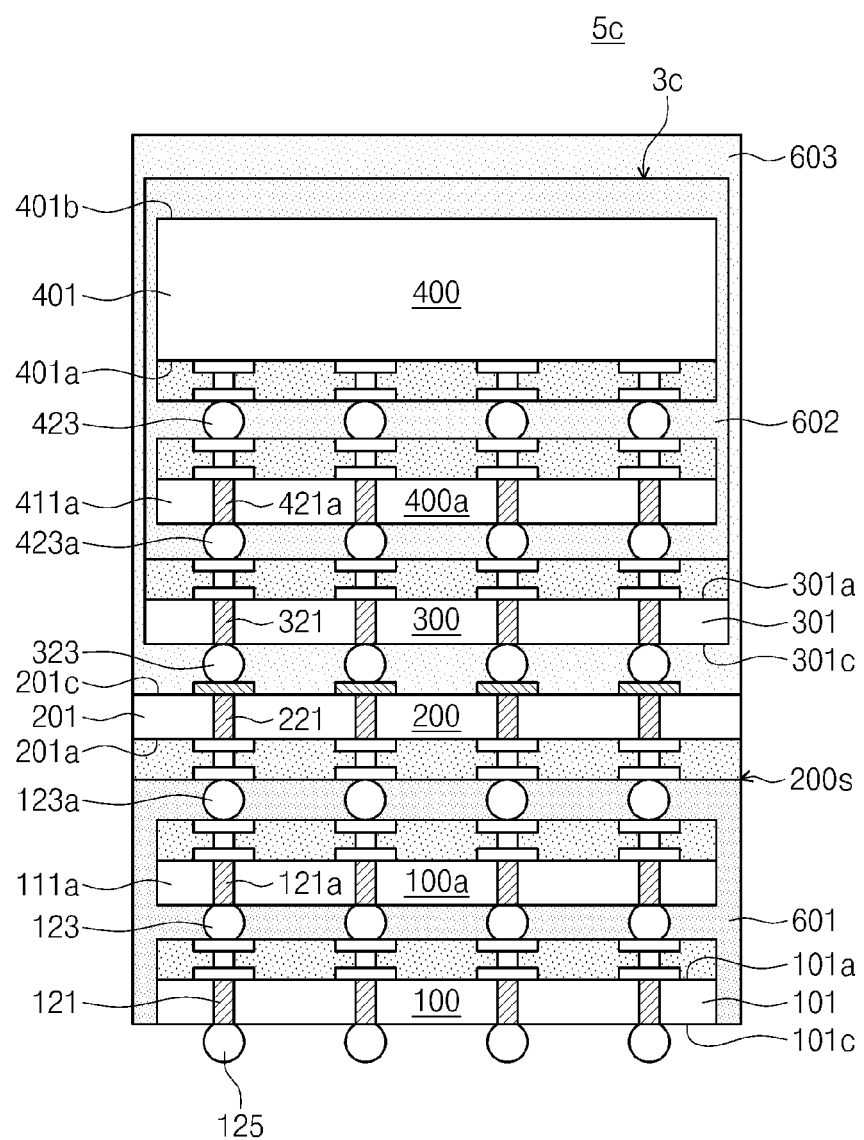
FIG. 1N is a sectional view illustrating a semiconductor package according to an embodiment modified from that of FIG. 1L.
Figure 10:
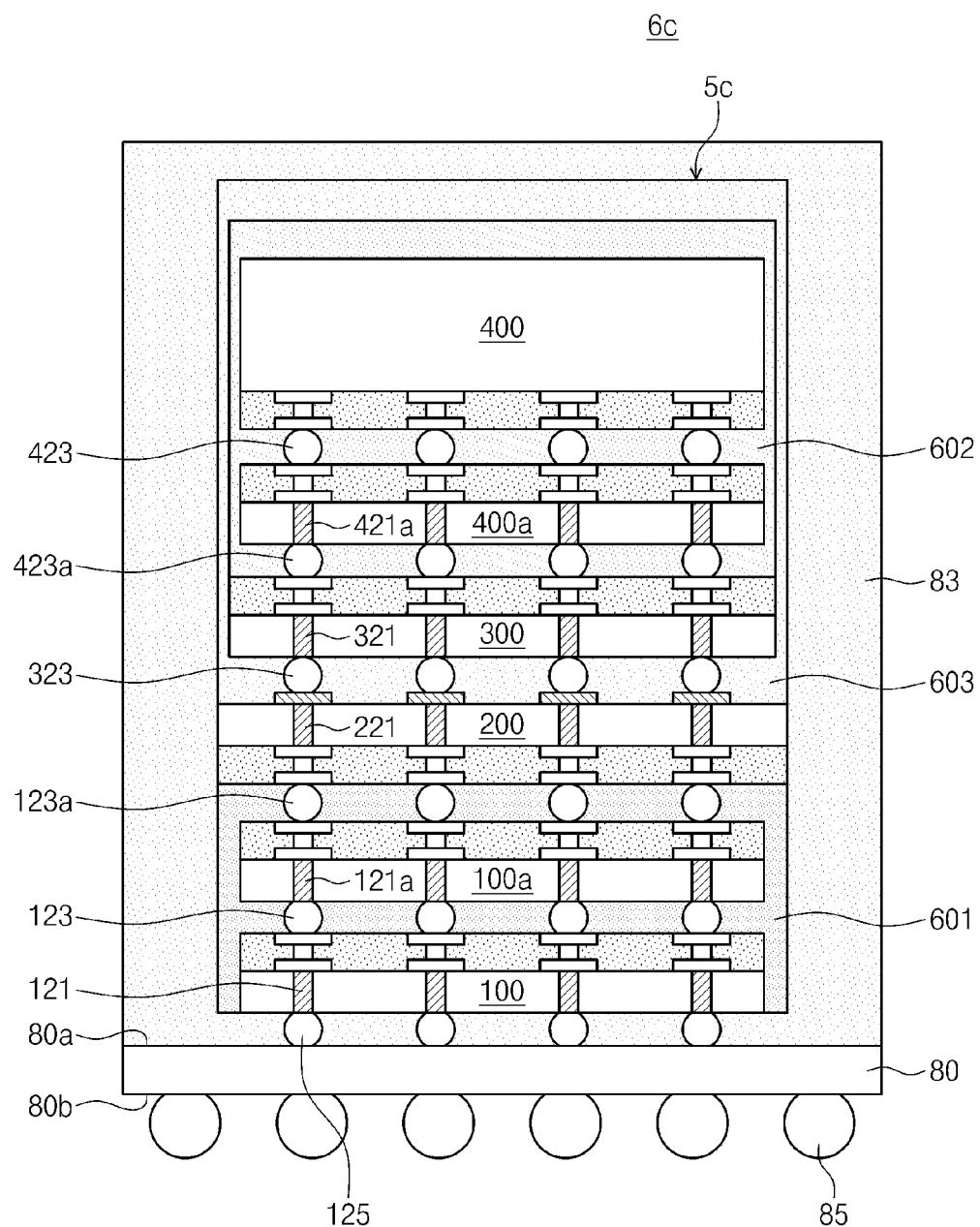
Figure 1P:
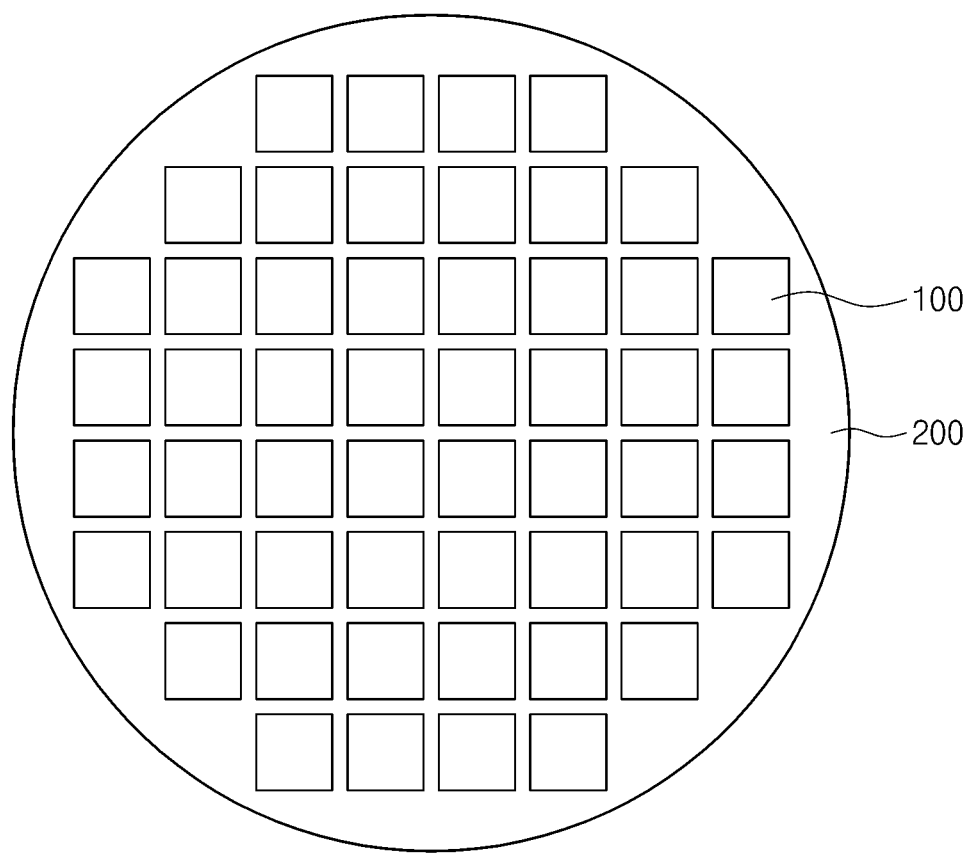
FIG. 1P is a plan view of the example embodiment of FIG. 1A.

An example embodiment of FIG. 1A is shown in a plan view in FIG. 1P.

Referring to FIG. 1B, a first mold layer 601 may be formed on the second semiconductor chip 200, and then, the second semiconductor chip 200 may be thinned. For example, the first mold layer 601 may be formed on the front surface 201a of the second semiconductor substrate 201 to cover the first semiconductor chips 100, and then, the back surface 201b of the second semiconductor substrate 201 may be thinned by a mechanical process such as polishing. In an example embodiment, the polishing may be performed by a grinder. Other processes to thin the back surface 201b may be used.

The first mold layer 601 may be formed to have a thickness to provide rigidity to the second semiconductor substrate 201 from being bent, during performing the backside polishing on the second semiconductor chip 200. The first mold layer 601 may include an insulating material or a polymer material (e.g., an epoxy resin). The first mold layer 601 may include an epoxy filler composite that is formed to have a thermal expansion coefficient (CTE) similar to that of silicon. For example, given than the CTE of silicon is about 3 ppm/° C., the epoxy filler composite may be formed to have a CTE of about 5-7 ppm/° C. In an example embodiment, the CTE of the substrate of the second semiconductor chip 200 and the CTE of the first mold layer 601 are within an order of magnitude. In another example embodiment, a ratio of the CTE of the substrate of the second semiconductor chip 200 and a CTE of the first mold layer 601 is in a range from 1 to 3. In example embodiments, the epoxy filler composite may include a mixture of an epoxy resin and silica that is formed to have a silica content of about 80 wt %. Likewise, in the case where the CTE of the first mold layer 601 is similar to that of the second semiconductor substrate 201, it may be possible to prevent or suppress the second semiconductor substrate 201 from bending.

To reduce a thickness of the second semiconductor chip 200, the back surface 201b of the second semiconductor substrate 201 may be polished by a grinder 90, while the second semiconductor chip 200 is supported by the first mold layer 601. As the result of the back-side polishing on the second semiconductor chip 200, the second semiconductor substrate 201 may be thinned to have a recessed back surface 201c exposing the second through electrodes 221 in a via-first manner. In example embodiments, the first mold layer 601 may be used as a carrier in the back-side polishing process. This may make it possible to omit additional processes of bonding and debonding a carrier. In example embodiment, a carrier is not bonded to the first nor the second semiconductor chips 100, 200, so a subsequent debonding of the carrier is not necessary. As a consequence of omitting the bonding and debonding of a carrier, at least two steps in the fabrication process are eliminated and allows for reduced cost and time.

Referring to FIG. 1C, back-side electrodes 223 may be formed on the recessed back surface 201c, i.e. the thinned back surface, of the second semiconductor substrate 201 in a via-middle manner. The back-side electrodes 223 may be electrically connected to the second through electrodes 221, respectively, and each of the back-side electrodes 223 may be provided in the form of a pad. As the result of the above described processes, the plurality of first semiconductor chips 100 encapsulated with the first mold layer 601 may be stacked in a chip-on-wafer (COW) manner on the wafer-level second semiconductor chip 200, thereby forming a first wafer-level package 1 having a 2-height stacked micropillar grid array structure.

In an example embodiment, a width of the first semiconductor chip 100 is less than a width of the second semiconductor chip 200 (see horizontal width in FIG. 1A).

Referring to FIG. 1D, a plurality of fourth semiconductor chips 400 may be stacked in a chip-on-wafer (COW) manner on the third semiconductor chip 300. For example, the fourth semiconductor chips 400 may be stacked on a third semiconductor substrate 301 of a third semiconductor chip 300 to form the chip-on-wafer structure.

Third semiconductor chip 300 may include the third semiconductor substrate 301 having a front surface 301a and a back surface 301b, a third integrated circuit layer 303 provided on the front surface 301a of the third semiconductor substrate 301, and one or more third through electrodes 321 vertically penetrating a portion of the third semiconductor substrate 301 to be electrically connected to the third integrated circuit layer 303. The third semiconductor substrate 301 may be a wafer-level semiconductor substrate made of a semiconductor material (e.g., silicon). The third integrated circuit layer 303 may include a memory circuit, a logic circuit, or any combination thereof. The third through electrode 321 may be provided, in a via-first or via-middle manner, on the third semiconductor substrate 301.

The fourth semiconductor chip 400 may include a fourth semiconductor substrate 401 having a front surface 401a and a back surface 401b, and a fourth integrated circuit layer 403 provided on the front surface 401a of the fourth semiconductor substrate 401. The fourth semiconductor chip 400 may be configured to have no through electrode. The fourth semiconductor substrate 401 may be provided in the form of a chip (or in chip-level) and be made of a semiconductor material (e.g., silicon). The fourth integrated circuit layer 403 may include a memory circuit, a logic circuit, or any combination thereof.

The fourth semiconductor chips 400 may be stacked, in the front-to-front manner, on the third semiconductor chip 300 and be electrically connected to the third semiconductor chip 300. For example, the fourth semiconductor chips 400 may be bonded in a flip-chip manner on the third semiconductor chip 300, and thus, the front surface 301a of the third semiconductor substrate 301 may face the front surface 401a of the fourth semiconductor substrate 401. Second connection electrodes 423 (e.g., provided in the form of a solder ball) may be provided between the third semiconductor chip 300 and the fourth semiconductor chip 400 to connect the third integrated circuit layer 303 electrically to the fourth integrated circuit layer 403.

Referring to FIG. 1E, a second mold layer 602 may be formed on the third semiconductor chip 300, and then, the third semiconductor chip 300 may be thinned. For example, the second mold layer 602 may be formed on the front surface 301a of the third semiconductor substrate 301 to cover the fourth semiconductor chips 400, and then, the back surface 301b of the third semiconductor substrate 301 may be polished.

The second mold layer 602 may be formed to have a thickness preventing the third semiconductor substrate 301 from being bent, during performing the back-side polishing on the third semiconductor chip 300. The second mold layer 602 may include the same or similar material as that of the first mold layer 601. For example, the second mold layer 602 may include an epoxy filler composite, whose CTE is about 5-7 ppm/° C. In an example embodiment, the CTE of the substrate of the third semiconductor chip 300 and the CTE of the second mold layer 602 are within an order of magnitude. In another example embodiment, a ratio of the CTE of the substrate of the third semiconductor chip 300 and a CTE of the second mold layer 602 is in a range from 1 to 3. In example embodiments, the second mold layer 602 may include a mixture of an epoxy resin and silica that is formed to have a silica content of about 80 wt %. Likewise, in the case where the CTE of the second mold layer 602 is similar to that of the third semiconductor substrate 301, it may be possible to prevent or suppress the third semiconductor substrate 301 from bending.

To reduce a thickness of the third semiconductor chip 300, the back surface 301b of the third semiconductor substrate 301 may be polished by the grinder 90, while the third semiconductor chip 300 is supported by the second mold layer 602. As the result of the back-side polishing on the third semiconductor chip 300, the third semiconductor substrate 301 may be thinned to have a recessed back surface 301c exposing the third through electrodes 321. In example embodiments, the second mold layer 602 may be used as a carrier in the back-side polishing process. This may make it possible to omit additional processes of bonding and debonding a carrier, as described above.

Referring to FIG. 1F, back-side electrodes 323 may be formed on the back surface 301c of the third semiconductor substrate 301 and be electrically connected to the third through electrodes 321. In example embodiments, each of the back-side electrodes 323 may be provided in the form of a solder ball. As the result of the afore-described processes, the plurality of the fourth semiconductor chips 400 encapsulated with the second mold layer 602 may be stacked in a chip-on-wafer (COW) manner on the wafer-level third semiconductor chip 300, thereby forming a second wafer-level package 2 having a 2-height stacked micropillar grid array structure.

Referring to FIG. 1G, a sawing process may be performed to the second wafer-level package 2. For example, in the sawing process, a blade 95 or a laser beam may be used to cut the second mold layer 602 and the third semiconductor chip 300 between the fourth semiconductor chips 400.

Referring to FIG. 1H, As the result of the afore-described processes, the fourth semiconductor chip 400 encapsulated with the second mold layer 602 may be stacked on the chip-level third semiconductor chip 300, thereby forming a chip-level stacked package 3 having a 2-height stacked micropillar grid array structure.

In an example embodiment, a width of the third semiconductor chip 300 is less than a width of the fourth semiconductor chip 400 (see horizontal width in FIG. 1H).

Referring to FIG. 1I, a plurality of stacked packages 3 may be stacked in a chip-on-wafer (COW) manner on the first wafer-level package 1, and then, be encapsulated. For example, this process may include inverting, or flipping, the first wafer-level package 1 in such a way that the recessed back surface 201*c* of the second semiconductor substrate 201 faces upward, stacking the stacked packages 3 on the recessed back surface 201*c* of the second semiconductor substrate 201, and then, forming a third mold layer 603 on the recessed back surface 201*c* of the second semiconductor substrate 201 to encapsulate the stacked packages 3. Accordingly, a package stack 4 may be formed to include the first wafer-level package 1 and the stacked packages 3 stacked thereon.

The third semiconductor chips 300 may be stacked in a back-to-back manner on the second semiconductor chip 200, and thus, the back surface 301*c* of the third semiconductor substrate 301 may face the back surface 201*c* of the second semiconductor substrate 201. The third through electrodes 321 may be connected to the second through electrodes 221 via the back-side electrodes 323 of the third semiconductor chip 300 and the back-side electrodes 223 of the second semiconductor chip 200, and thus, the stacked packages 3 may be electrically connected to the first wafer-level package 1. The third mold layer 603 may be formed of the same or similar material as the first mold layer 601 and/or the second mold layer 602.

Referring to FIG. 1J, a polishing process may be performed to a back surface of the package stack 4. For example, the first mold layer 601 and the first semiconductor substrate 101 may be polished by the grinder 90, while the first wafer-level package 1 is supported by the third mold layer 603, thereby thinning the first semiconductor chips 100. As the result of the polishing process, the first semiconductor substrate 101 may be thinned to have a recessed back surface 101*c* exposing the first through electrodes 121. As the result of the polishing process, a shape of the first mold layer 601 may also be changed to expose the recessed back surface 101*c* of the first semiconductor substrate 101.

Referring to FIG. 1K, outer electrodes 125 may be formed on the first semiconductor chips 100, and then, a sawing process may be performed to the package stack 4. For example, the outer electrodes 125 may be formed on the back surface 101*c* of the first semiconductor substrate 101 and be electrically connected to the first through electrodes 121. In example embodiments, each of the outer electrodes 125 may be provided in the form of a solder ball. After or before the formation of the outer electrodes 125, the sawing process may include cutting the third mold layer 603, the second semiconductor chip 200 and the first mold layer 601 using the blade 95 or the laser beam.

Referring to FIG. 1L, a semiconductor package 5 having a 4-height stacked micropillar grid array structure may be formed as the result of the sawing process to the package stack 4. The semiconductor package 5 may be one of chip-level elements divided by the sawing process and include the stacked package 3 stacked on the second semiconductor chip 200.

For example, the semiconductor package 5 may include the first semiconductor chip 100, in which the first semiconductor substrate 101 with the upward front surface 101*a* is provided and the first through electrodes 121 are provided, the second semiconductor chip 200 stacked in the front-to-front manner on the first semiconductor chip 100 to have the second through electrodes 221, the third semiconductor chip 300 stacked in the back-to-back manner on the second semiconductor chip 200 to have the third through electrodes 321, and the fourth semiconductor chip 400 stacked in the front-to-front manner on the third semiconductor chip 300.

The first through electrodes 121 may be connected to the second through electrodes 221 via the first connection electrodes 123, and thus, the first semiconductor chip 100 and the second semiconductor chip 200 may be electrically connected to each other. Similarly, the second through electrodes 221 may be connected to the third through electrodes 321 via the back-side electrodes 323, and thus, the second semiconductor chip 200 and the third semiconductor chip 300 may be electrically connected to each other. The third semiconductor chip 300 and the fourth semiconductor chip 400 may be electrically connected to each other, because the second connection electrodes 423 are connected to the third through electrodes 321.

The first semiconductor chip 100 may be encapsulated by the first mold layer 601 exposing the back surface 101*c* of the first semiconductor substrate 101. The second semiconductor chip 200 may be partially encapsulated by the first mold layer 601 and the third mold layer 603, and the second semiconductor chip 200 may be formed to have a side surface 200*s* exposed to the outside. The fourth semiconductor chip 400 may be stacked on the third semiconductor chip 300, and the stacked package 3 encapsulated with the second mold layer 602 may be encapsulated with the third mold layer 603. Accordingly, the third semiconductor chip 300 may be encapsulated with the second mold layer 602 and the third mold layer 603, and the fourth semiconductor chip 400 may be doubly encapsulated with the second mold layer 602 and the third mold layer 603. In other example embodiments, the third mold layer 603 may be formed to encapsulate the top and bottom surfaces of the stacked package 3 and expose a side surface 3*s* of the stacked package 3.

The outer electrodes 125 on the back surface 101*c* of the first semiconductor substrate 101 may be connected to an electric device, such as a semiconductor chip, a semiconductor package, a printed circuit board, or a module substrate, and thus, the semiconductor package 5 may be electrically connected to the electric device.

In certain embodiments, as shown in FIG. 1N, a semiconductor package 5*c* may be fabricated to have a stacked micropillar grid array structure. For example, the semiconductor package 5*c* may be fabricated in such a way that a first upper semiconductor chip 100*a* may be further provided between the first semiconductor chip 100 (hereinafter, referred to as a first lower semiconductor chip) and the second semiconductor chip 200 and a fourth lower semiconductor chip 400*a* may be further provided between the third semiconductor chip 300 and the fourth semiconductor chip 400 (hereinafter, referred to as a fourth upper semiconductor chip). Here, the first upper semiconductor chip 100*a* may have the same or similar structure to that of the first lower semiconductor chip 100, and the fourth lower semiconductor chip 400a may have the same or similar structure to that of the fourth upper semiconductor chip 400.

The first upper semiconductor chip 100a may include a semiconductor substrate 111a having through electrodes 121a and connection electrodes 123a, which may be electrically connected to the first lower semiconductor chip 100 and the second semiconductor chip 200, respectively. The first upper semiconductor chip 100a may be stacked in a chip-on-wafer (COW) manner on the second semiconductor chip 200, before the stacking of the first lower semiconductor chip 100 in the fabrication of the first wafer-level package 1 of FIG. 1C, and then, be encapsulated with the first mold layer 601. The first upper semiconductor chip 100a may be provided to form a back-to-front structure with respect to the first lower semiconductor chip 100 and form a front-to-front structure with respect to the second semiconductor chip 200.

The fourth lower semiconductor chip 400a may include a semiconductor substrate 411a having through electrodes 421a and connection electrodes 423a, which may be electrically connected to the third semiconductor chip 300 and the fourth upper semiconductor chip 400, respectively. The fourth lower semiconductor chip 400a may be stacked in a chip-on-wafer (COW) manner on the third semiconductor chip 300, before the stacking of the fourth upper semiconductor chip 400 in the fabrication of the second wafer-level package 2 of FIG. 1F, and then, be encapsulated with the second mold layer 602. The fourth lower semiconductor chip 400a may be provided to form a back-to-front structure with respect to the third semiconductor chip 300 and form a front-to-front structure with respect to the fourth upper semiconductor chip 400.

Referring to FIG. 1M, the semiconductor package 5 may be mounted on a package substrate 80, thereby forming a semiconductor package 6. For example, the formation of the semiconductor package 6 may include mounting the semiconductor package 5 on a front surface 80a of the package substrate 80 (e.g., printed circuit board) and forming an outer mold layer 83 to cover the semiconductor package 5. Solder balls 85 may be attached on a back surface 80b of the package substrate 80. The semiconductor package 5 may be electrically connected to the package substrate 80 via the outer electrodes 125 and be electrically connected to an electric device, such as a semiconductor chip, a semiconductor package, or a module substrate, via the solder balls 85.

In certain embodiments, as shown in a semiconductor package 6c of FIG. 1O, the semiconductor package 5c of FIG. 1N may be mounted on the package substrate 80 (e.g., PCB) and the outer mold layer 83 may be formed thereon.

FIGS. 2A through 2I are sectional views illustrating a method of fabricating a semiconductor package according to other example embodiments of the inventive concept. For the sake of brevity, the elements and features of this example that are similar to those previously shown and described will not be described in much further detail.

Figure 2A:
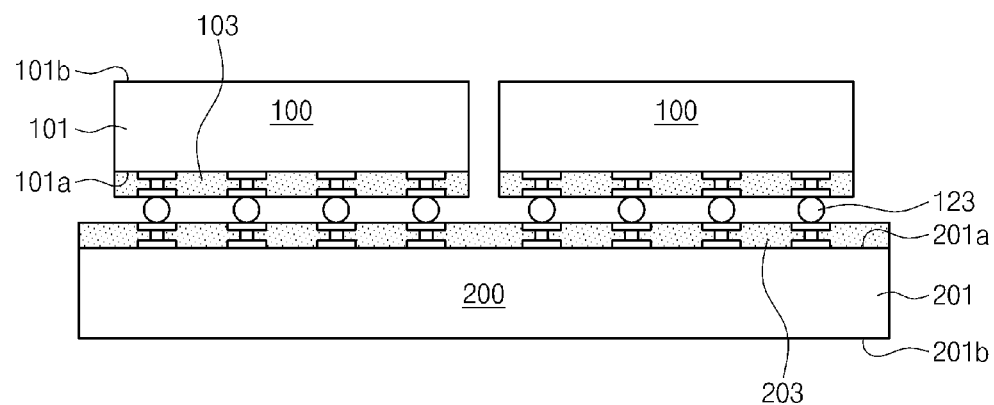
FIGS. 2A through 2I are sectional views illustrating a method of fabricating a semiconductor package according to other example embodiments of the inventive concept.

Referring to FIG. 2A, a plurality of the first semiconductor chips 100 may be bonded in a chip-on-wafer and flip-chip manner on the front surface 201a of the second semiconductor substrate 201 of the second semiconductor chip 200. The first semiconductor chips 100 may be stacked in the front-to-front manner on the second semiconductor chip 200 and be electrically connected to the second semiconductor chip 200 via the first connection electrodes 123. The first semiconductor chip 100 may include the first integrated circuit layer 103 provided on the front surface 101a of the chip-level first semiconductor substrate 101. The second semiconductor chip 200 may include the second integrated circuit layer 203 provided on the front surface 201a of the wafer-level second semiconductor substrate 201.

Figure 2B:
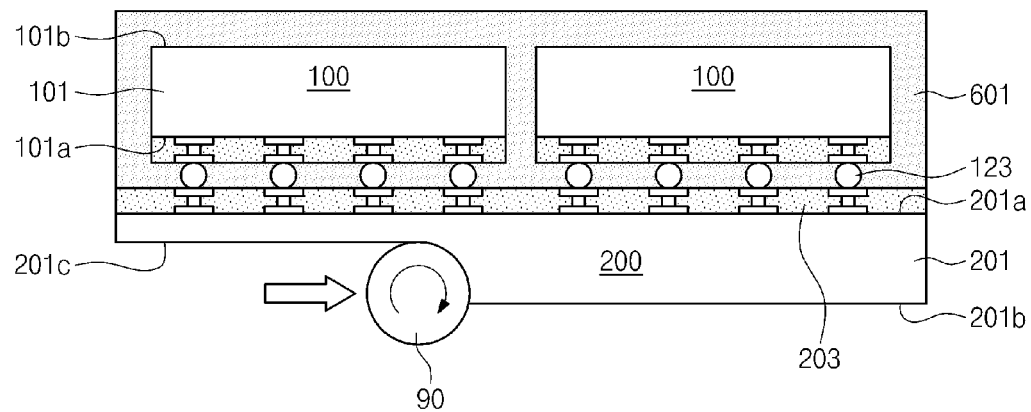

Referring to FIG. 2B, the first mold layer 601 may be formed on the front surface 201a of the second semiconductor substrate 201 to cover the first semiconductor chips 100. Thereafter, the back surface 201b of the second semiconductor substrate 201 may be polished by the grinder 90, while the second semiconductor chip 200 is supported by the first mold layer 601. As the result of the back-side polishing process, the second semiconductor substrate 201 may be thinned to have the recess back surface 201c exposed to the outside.

Figure 2C:
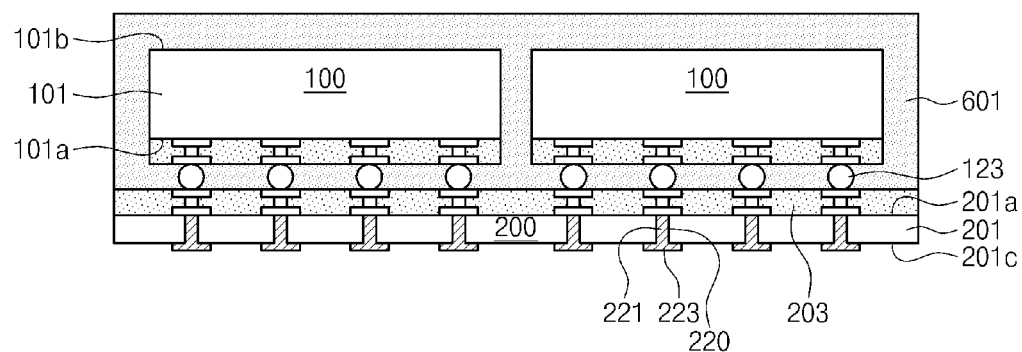

Referring to FIG. 2C, the second through electrodes 221 may be formed through the second semiconductor substrate 201 and be electrically connected to the second integrated circuit layer 203. For example, the formation of the second through electrode 221 may include forming vertical hole 220 by dry-etching or drilling the back surface 201c of the second semiconductor substrate 201, and then, filling the vertical hole 220 with a conductive material (e.g., tungsten or copper) using a electroplating or deposition process.

The pad-shaped back-side electrode 223 may be further formed on the back surface 201c of the second semiconductor substrate 201 to be connected to the second through electrode 221. In example embodiments, the back-side electrode 223 may be formed using the plating or deposition process for forming the second through electrode 221, and thus, the back-side electrode 223 and the second through electrode 221 may be formed at the same time and form a single structure. In other example embodiments, the back-side electrode 223 may be formed using an additional process, after the formation of the second through electrode 221.

As the result of the afore-described processes, the first semiconductor chips 100 may be stacked in a chip-on-wafer (COW) manner on the wafer-level second semiconductor chip 200 including the second through electrodes 221 formed by a via last process, thereby forming a first wafer-level package 1a having a 2-height stacked micropillar grid array structure.

Figure 2D:
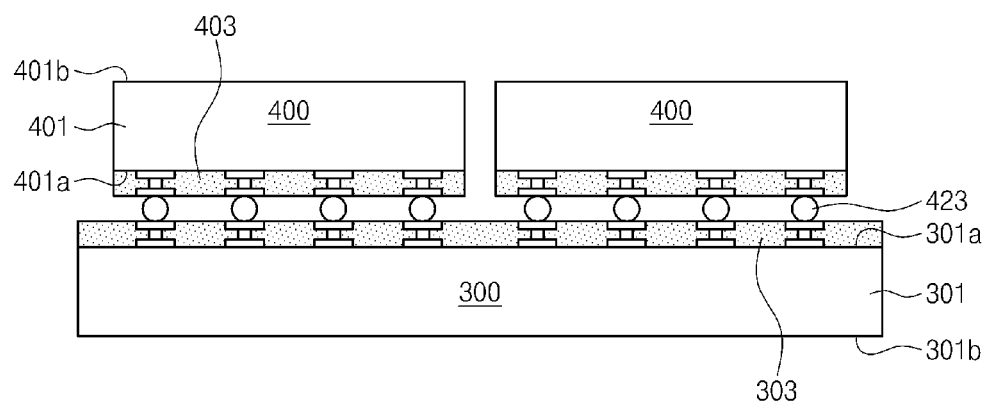

Referring to FIG. 2D, a plurality of the fourth semiconductor chips 400 may be bonded in a chip-on-wafer and flip-chip manner on the front surface 301a of the third semiconductor substrate 301 of the third semiconductor chip 300. The fourth semiconductor chips 400 may be stacked in the front-to-front manner on the third semiconductor chip 300 and be electrically connected to the third semiconductor chip 300 via the second connection electrodes 423. The third semiconductor chip 300 may include the third integrated circuit layer 303 provided on the front surface 301a of the wafer-level third semiconductor substrate 301. The fourth semiconductor chip 400 may include the fourth integrated circuit layer 403 provided on the front surface 401a of the chip-level fourth semiconductor substrate 401.

Figure 2E:
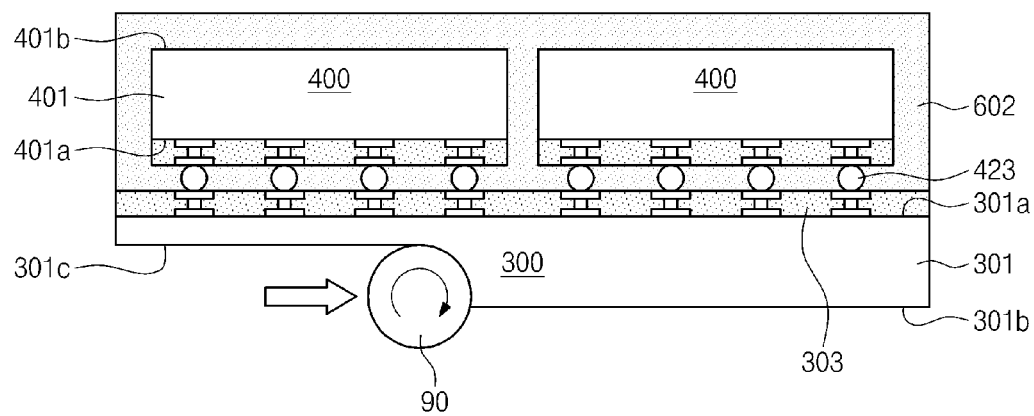

Referring to FIG. 2E, the second mold layer 602 may be formed on the front surface 301a of the third semiconductor substrate 301 to cover the fourth semiconductor chips 400. Thereafter, the back surface 301b of the third semiconductor substrate 301 may be polished by the grinder 90, while the third semiconductor chip 300 is supported by the second mold layer 602. As the result of the back-side polishing process, the third semiconductor substrate 301 may be thinned to have the recess back surface 301c exposed to the outside.

Figure 2F:
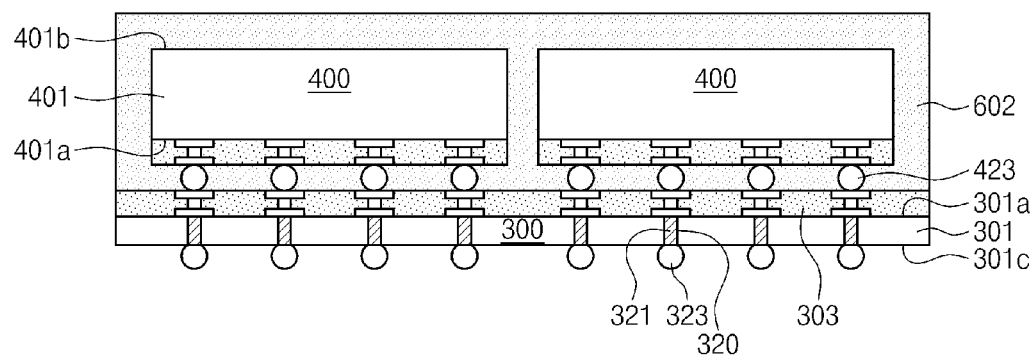

Referring to FIG. 2F, the third through electrodes 321 may be formed through the third semiconductor substrate 301 and be electrically connected to the third integrated circuit layer 303. For example, the formation of the third through electrode 321 may include forming vertical hole 320 by dry-etching or drilling the back surface 301c of the third semiconductor substrate 301, and then, filling the vertical hole 320 with a conductive material (e.g., tungsten or copper) using a electroplating or deposition process. The solder-ball-shaped back-side electrode 323 may be further formed on the back surface 301c of the third semiconductor substrate 301 to be connected to the third through electrode 321.

As the result of the afore-described processes, the fourth semiconductor chips 400 may be stacked in a chip-on-wafer (COW) manner on the wafer-level third semiconductor chip 300, in which the third through electrodes 321 formed by a via last process are provided, thereby forming a second wafer-level package 2a having a 2-height stacked micropillar grid array structure.

Figure 2G:
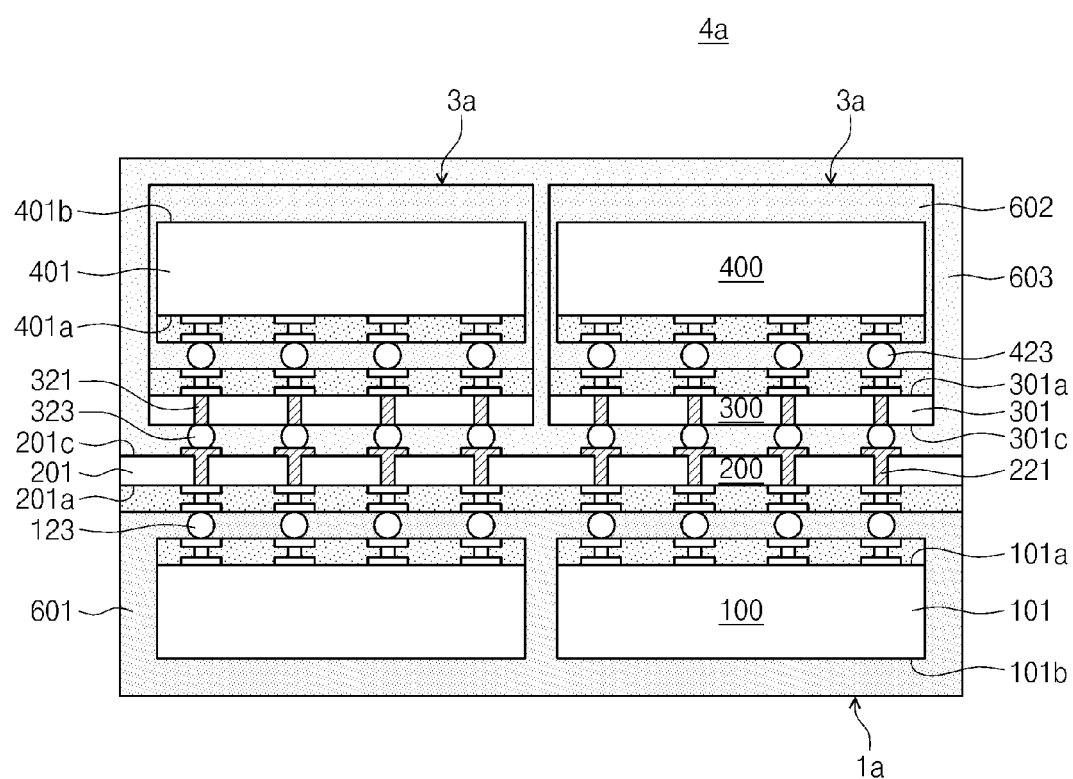

Referring to FIG. 2G, the second wafer-level package 2a may be sawn to form a plurality of stacked packages 3a, and then, the stacked packages 3a may be stacked in a chip-on-wafer (COW) manner on the first wafer-level package 1a and be encapsulated. For example, the stacked packages 3a may be stacked on the back surface 201c of the second semiconductor substrate 201, and then, the third mold layer 603 may be formed on the back surface 201c of the second semiconductor substrate 201 to encapsulate the stacked packages 3a. Accordingly, a package stack 4a may be formed to include the first wafer-level package 1a and the stacked packages 2a stacked thereon.

Figure 2H:
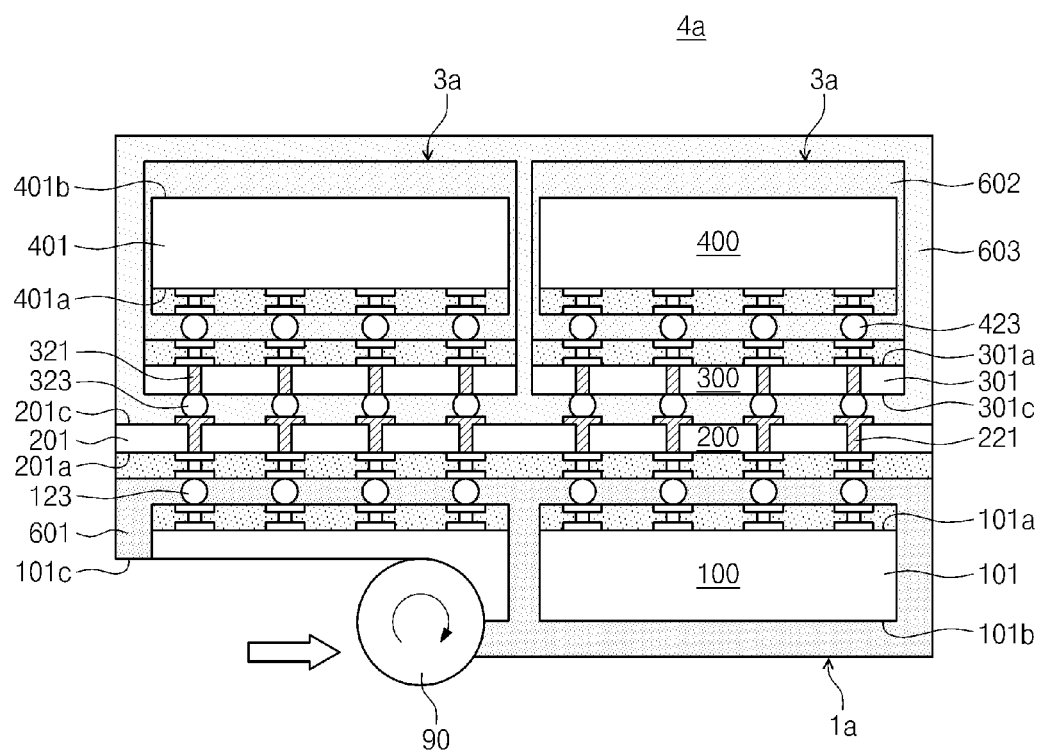

Referring to FIG. 2H, the first mold layer 601 and the back surface 101b of the first semiconductor substrate 101 may be polished by the grinder 90 to reduce a thickness of the first semiconductor chips 100, while the first wafer-level package 1a is supported by the third mold layer 603. As the result of the back-side polishing process, the first semiconductor substrate 101 may be thinned to have the recessed back surface 101c exposing the first through electrodes 121.

Figure 2I:
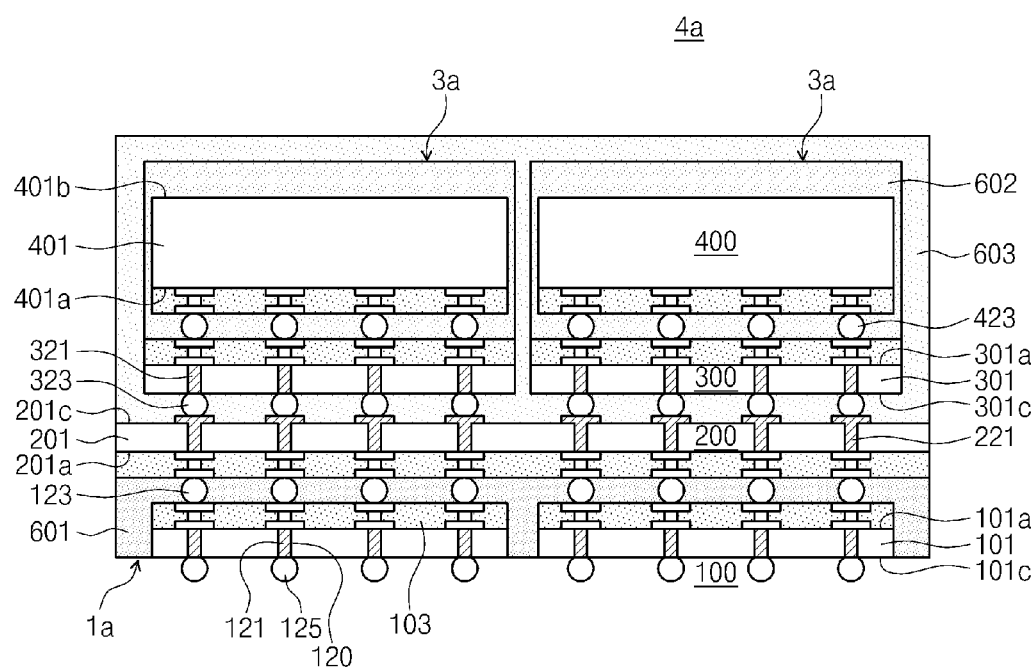

Referring to FIG. 2I, a via-last process may be performed to form the first through electrodes 121 electrically connected to the first integrated circuit layer 103 through the first semiconductor substrate 101. For example, the formation of the first through electrode 121 may include forming vertical hole 120 by dry-etching or drilling the back surface 101c of the first semiconductor substrate 101, and then, filling the vertical hole 120 with a conductive material (e.g., tungsten or copper) using a electroplating or deposition process. The solder-ball-shaped outer electrode 125 may be further formed on the back surface 101c of the first semiconductor substrate 101 to be connected to the first through electrode 121. Thereafter, a sawing process may be performed to the package stack 4a in the same or similar manner as that described with reference to FIG. 1K, thereby forming the semiconductor package 5 of FIG. 1L. The semiconductor package 5 obtained from the sawing of the package stack 4a may be mounted on the package substrate 80, as shown in FIG. 1M, to form the semiconductor package 6.

FIGS. 3A through 3E are sectional views illustrating a method of fabricating a semiconductor package according to still other example embodiments of the inventive concept. For the sake of brevity, the elements and features of this example that are similar to those previously shown and described will not be described in much further detail.

Figure 3A:
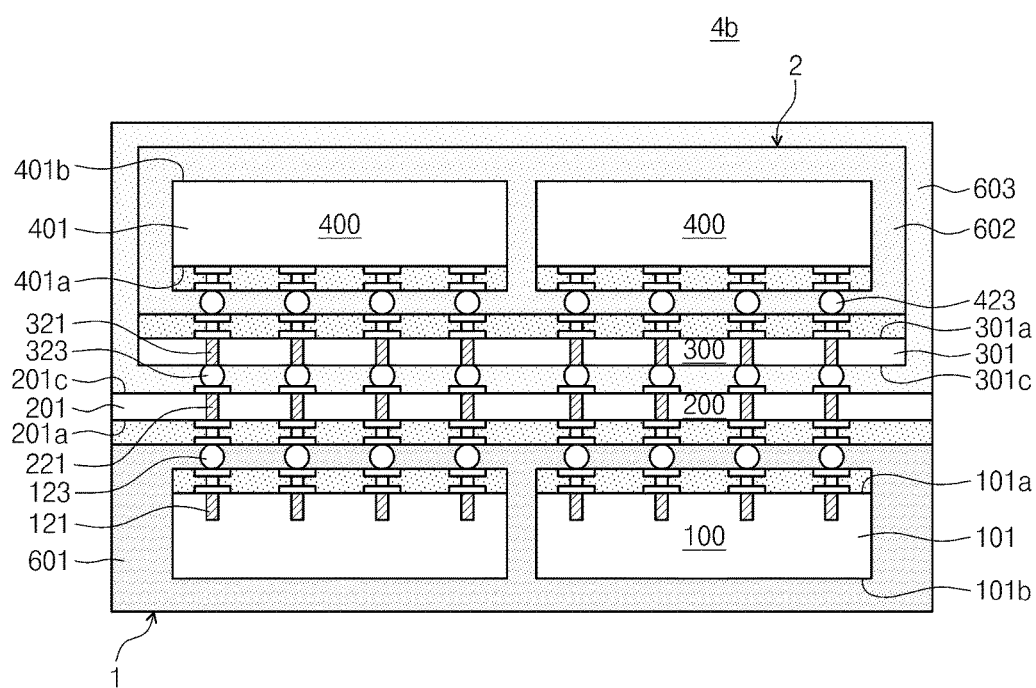
FIGS. 3A through 3E are sectional views illustrating a method of fabricating a semiconductor package according to still other example embodiments of the inventive concept.

Referring to FIG. 3A, the second wafer-level package 2 may be stacked on the first wafer-level package 1 and be encapsulated to form a package stack 4b. For example, the first wafer-level package 1 may be formed using, for example, the same or similar process as that described with reference to FIGS. 1A through 1C to have a 2-height stacked micropillar grid array structure, and the second wafer-level package 2 may be formed using, for example, the same or similar process as that described with reference to FIGS. 1D through 1F to have a 2-height stacked micropillar grid array structure. The second wafer-level package 2 may be stacked in a wafer-on-wafer (WOW) manner on the back surface 201c of the second semiconductor substrate 201 of the first wafer-level package 1, and the third mold layer 603 may be formed on the back surface 101c of the second semiconductor substrate 201 to encapsulate the second wafer-level package 2.

Figure 3B:
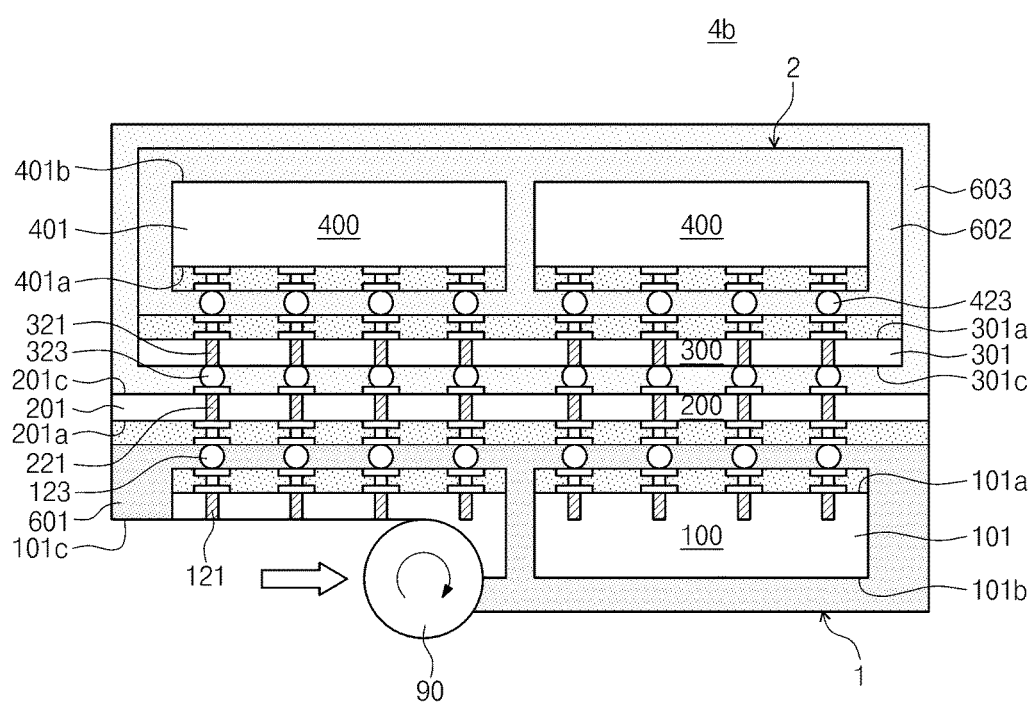

Referring to FIG. 3B, the first mold layer 601 and the back surface 101b of the first semiconductor substrate 101 may be polished by the grinder 90, while the first wafer-level package 1 is supported by the third mold layer 603. As the result of the back-side polishing process, the first semiconductor substrate 101 may be thinned to have the recess back surface 101c exposing the first through electrodes 121.

Figure 3C:
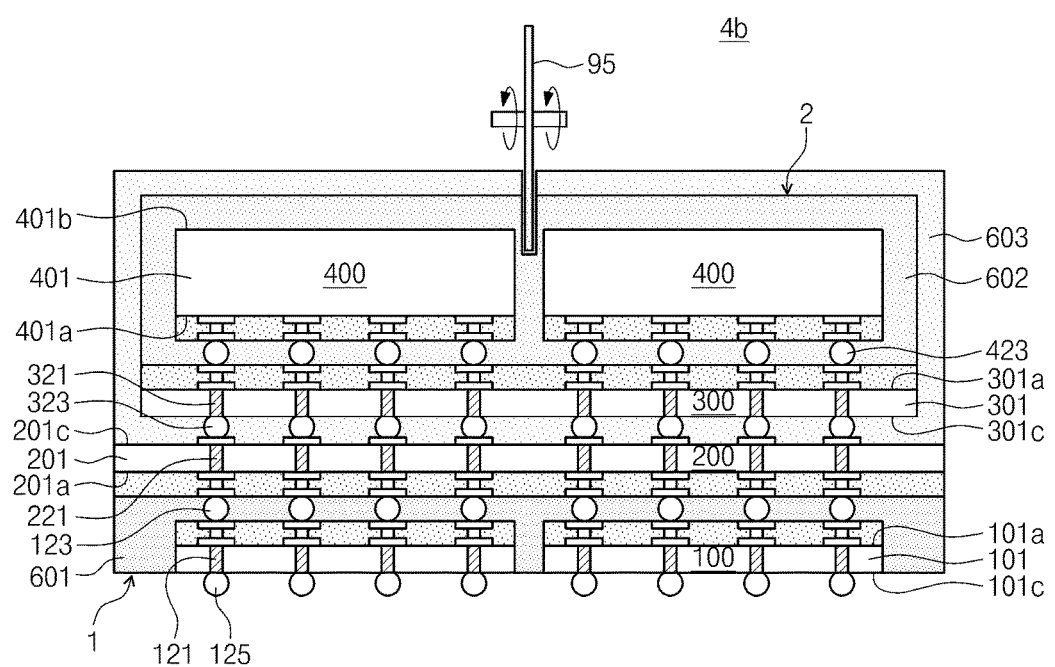

Referring to FIG. 3C, the outer electrodes 125 may be formed on the back surface 101c of the first semiconductor substrate 101 to be electrically connected to the first through electrodes 121. After or before the formation of the outer electrodes 125, a sawing process using the blade 95 or the laser beam may be performed to the package stack 4b.

Figure 3D:
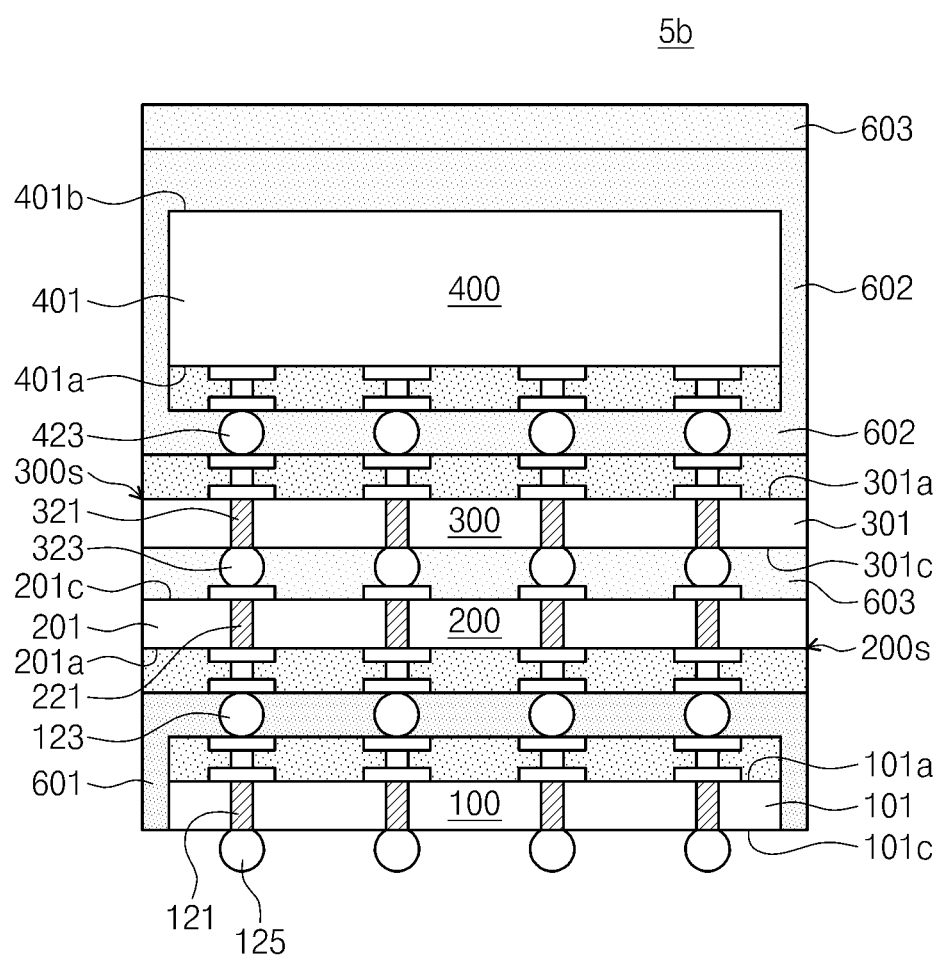

Referring to FIG. 3D, as the result of the sawing process to the package stack 4b, a semiconductor package 5b may be fabricated to include a 4H stacked micropillar grid array structure in which the first to fourth semiconductor chips 100-400 are sequentially stacked. In the semiconductor package 5b, the side surface 200s of the second semiconductor chip 200 and a side surface 300s of the third semiconductor chip 300 may be exposed to the outside. Except for this difference, the semiconductor package 5b may be configured to have the same or similar features as those of the semiconductor package 5 of FIG. 1L.

Figure 3E:
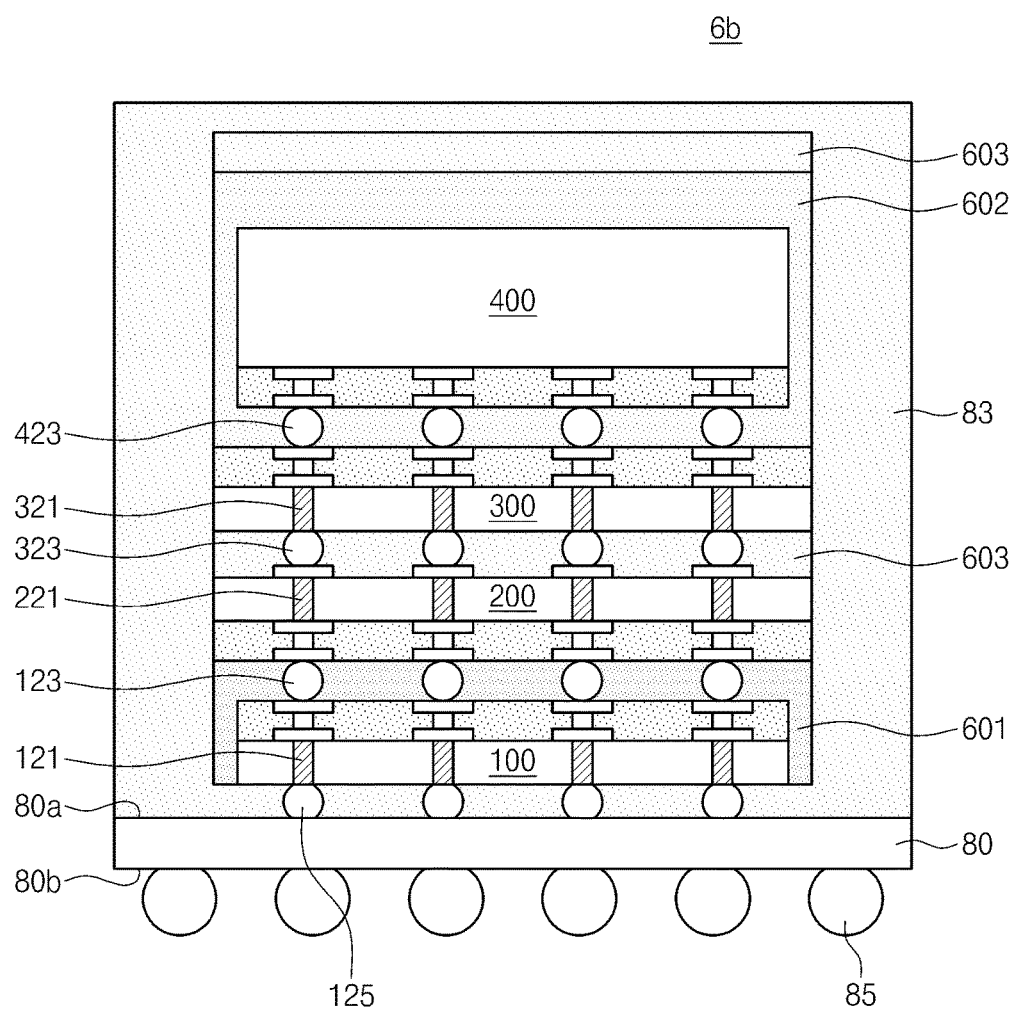

Referring to FIG. 3E, the semiconductor package 5b may be mounted on the front surface 80a of the package substrate 80 (e.g., PCB) and then be encapsulated with the outer mold layer 83 to form a semiconductor package 6b. The solder balls 85 may be attached on the back surface 80b of the package substrate 80 to connect the semiconductor package 6b electrically to other electric device, such as a semiconductor chip, a semiconductor package, a module substrate.

Figure 4A:
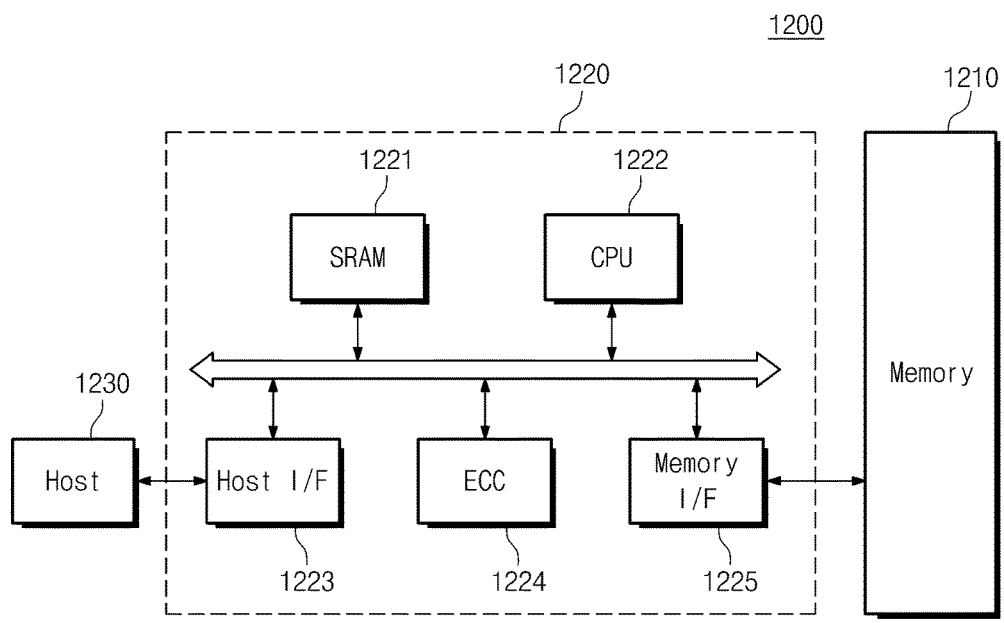
FIG. 4A is a block diagram illustrating a memory card including the semiconductor packages according to example embodiments of the inventive concept.
Figure 4B:
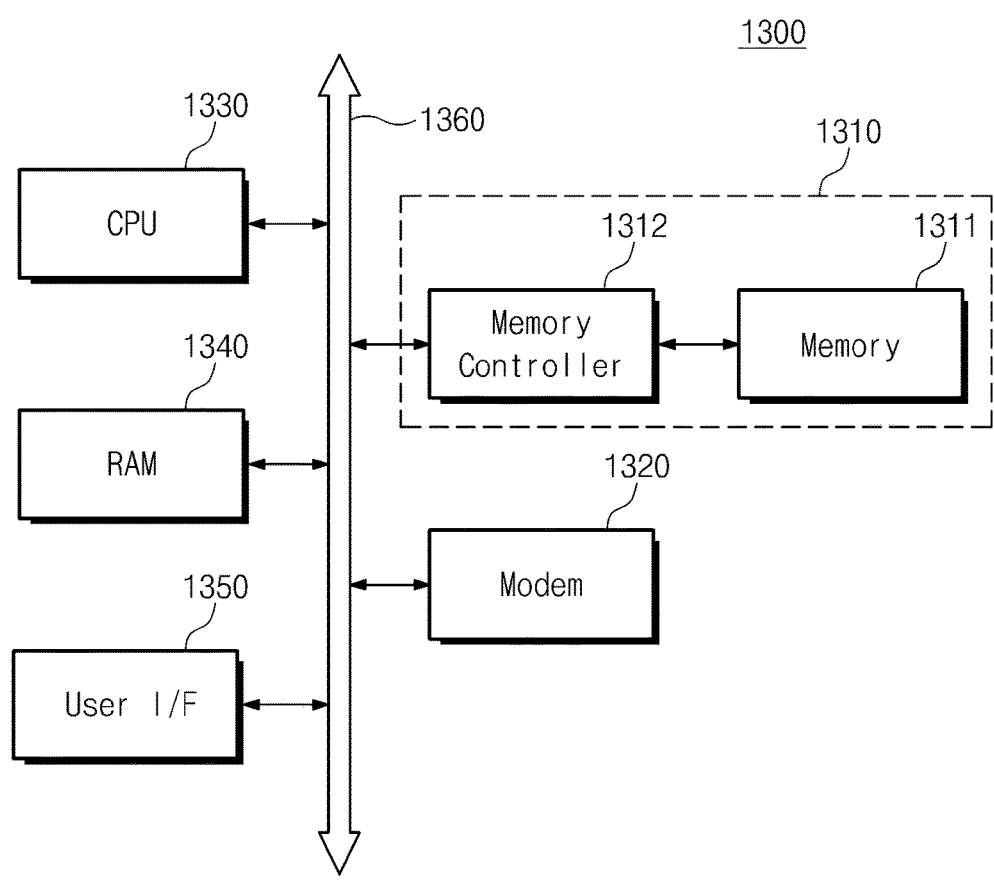
FIG. 4B is a block diagram illustrating an information processing system including the semiconductor packages according to example embodiments of the inventive concept.

FIG. 4A is a block diagram illustrating a memory card including the semiconductor packages according to example embodiments of the inventive concept. FIG. 4B is a block diagram illustrating an information processing system including the semiconductor packages according to example embodiments of the inventive concept.

Referring to FIG. 4A, a memory card 1200 may include a host 1230, a memory device 1210, and a memory controller 1220 controlling data exchanges therebetween. A static random access memory (SRAM) 1221 may be used as an operating memory of a processing unit 1222. A host interface 1223 may include a data exchange protocol of a host connected to a memory card 1200. An error correction block 1224 may be configured to detect and correct errors included in data read from a memory device 1210. A memory interface 1225 may be configured to interface with the memory device 1210. The processing unit 1222 may perform general control operations for data exchange of the memory controller 1220. The memory device 1210 may include at least one of the semiconductor packages 5, 6, 5*b*, and 6*b* according to example embodiments of the inventive concept.

Referring to FIG. 4B, an information processing system 1300 may be realized using a memory system 1310 including at least one of the semiconductor packages 5, 6, 5*b*, and 6*b* according to example embodiments of the inventive concept. For instance, the information processing system 1300 may be a mobile device and/or a computer. In example embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312, and in some embodiments, the memory system 1310 may be configured substantially identical to the memory card 1200 described with respect to FIG. 4A. Data processed by the CPU 1330 and/or input from the outside may be stored in the memory system 1310. In certain embodiments, the information processing system 1300 may further include or be, for example, an application chipset, a camera image sensor, a camera image signal processor (ISP), an input/output device, or the like.

According to example embodiments of the inventive concept, it is possible to perform a wafer polishing process without the use of an additional carrier. Accordingly, it is possible to omit additional processes of bonding and debonding a carrier and thereby to improve productivity and reduce fabrication cost. Since a mold layer to be formed on a wafer has a thermal expansion coefficient similar to that of the wafer, it is possible to prevent or suppress a bending or warp of the wafer and, consequently, process failures. In addition, the wafer molding technology according to example embodiments of the inventive concept can be applied to realize various ways (e.g., via-first, via-middle, and via-last processes) for forming the through electrode or TSV.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device comprising:
   a first semiconductor package comprising:
      a first chip comprising a first active layer provided on a first side of the first chip;
      a second chip comprising:
         first through-electrodes; and
         a second active layer provided on a second side of the second chip, the first chip and the second chip being stacked and the first active layer facing the second active layer; and
      a mold layer disposed between the first chip and the second chip; and
   a second semiconductor package comprising:
      a third chip comprising:
         second through-electrodes;
         a third active layer provided on a third side of the third chip; and
      a fourth chip comprising a fourth active layer provided on a fourth side of the fourth chip, the third chip and the fourth chip being stacked and the third active layer facing the fourth active layer;
   wherein a fifth side of the third chip, opposite to the third side of the third chip, is configured to face a sixth side of the second chip opposite to the second side of the second chip,
   wherein the third chip has a first width and the second chip has a second width that is larger than the first width,
   wherein in the first semiconductor package, no additional chip is provided between the first chip and the second chip, and
   wherein the fourth chip has a third width that is smaller than the first width of the third chip.

2. The semiconductor device of claim 1, wherein the first chip further comprises third through-electrodes.

3. The semiconductor device of claim 2 further comprising a plurality of electrodes which connect the first through-electrodes and the second through-electrodes.

4. A semiconductor device comprising:
   a first semiconductor package comprising:
      a first chip comprising:
         a first active layer provided on a first side of the first chip; and
         first through-electrodes;
      a second chip comprising:
         a second active layer provided on a second side of the second chip; and
         second through-electrodes, the first chip and the second chip being stacked and the first active layer facing the second active layer; and
      a mold layer disposed between the first chip and the second chip; and
   a second semiconductor package comprising:
      a third chip comprising:
         a third active layer provided on a third side of the third chip; and
         third through-electrodes; and
      a fourth chip comprising a fourth active layer provided on a fourth side of the fourth chip, the third chip and the fourth chip being stacked and the third active layer facing the fourth active layer;
   wherein a fifth side of the third chip, opposite to the third side of the third chip, is configured to face a sixth side of the second chip opposite to the second side of the second chip, wherein the semiconductor device further comprises a plurality of electrodes which connect the second through-electrodes and the third through-electrodes,
   wherein the first chip has a first width and the second chip has a second width that is longer than the first width, and
   wherein the fourth chip has a fourth width and the third chip has a third width that is longer than the fourth width.

5. The semiconductor device of claim 1, wherein a coefficient of thermal expansion (CTE) of a substrate of the second chip and a CTE of the mold layer are within an order of magnitude.

6. The semiconductor device of claim 1, wherein a ratio of a coefficient of thermal expansion (CTE) of a substrate of the second chip and a CTE of the mold layer is in a range from 1 to 3.

7. The semiconductor device of claim 1 further comprising first connection electrodes electrically connecting the first active layer and the second active layer.

8. A semiconductor device comprising:
a first semiconductor package comprising:
   a first chip comprising:
      a first active layer provided on a first side of the first chip; and
      first through-electrodes;
   a second chip being stacked on the first chip and comprising:
      a second active layer provided on a second side of the second chip; and
      second through-electrodes; and
   a mold layer disposed between the first chip and the second chip; and
a second semiconductor package comprising:
   a third chip comprising a third active layer provided on a third side of the third chip; and
   a fourth chip comprising a fourth active layer provided on a fourth side of the fourth chip, the fourth chip being stacked on the third chip;
   wherein a fifth side of the third chip, opposite to the third side of the third chip, is configured to face a sixth side of the second chip, opposite to the second side of the second chip,
   wherein the semiconductor device further comprises a plurality of electrodes which connect the second through electrodes and third through electrodes,
   wherein the first chip has a first width and the second chip has a second width that is longer than the first width, and
   wherein the fourth chip has a fourth width and the third chip as a third width that is longer than the fourth width.

9. The semiconductor device of claim 1, wherein the fourth chip comprises a non-through via semiconductor chip.

* * * * *